United States Patent
Hasegawa et al.

(10) Patent No.: US 7,362,546 B2
(45) Date of Patent: *Apr. 22, 2008

(54) SPIN-VALVE MAGNETORESISTIVE ELEMENT HAVING FIXED MAGNETIC LAYER OF EPITAXAL LAMINATE INCLUDING MAGNETIC LAYER AND NONMAGNETIC LAYER

(75) Inventors: Naoya Hasegawa, Niigata-ken (JP); Eiji Umetsu, Niigata-ken (JP); Masamichi Saito, Niigata-ken (JP); Yosuke Ide, Niigata-ken (JP); Masahiro Oshima, Niigata-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 284 days.

This patent is subject to a terminal disclaimer.

(21) Appl. No.: 10/925,268

(22) Filed: Aug. 24, 2004

(65) Prior Publication Data
US 2005/0018363 A1    Jan. 27, 2005

Related U.S. Application Data

(63) Continuation-in-part of application No. 10/783,159, filed on Feb. 20, 2004, now abandoned.

(30) Foreign Application Priority Data

Feb. 26, 2003  (JP) .............................. 2003-048694
Feb. 25, 2004  (JP) .............................. 2004-049709

(51) Int. Cl.
G11B 5/39   (2006.01)
G11B 5/127  (2006.01)

(52) U.S. Cl. .............................. 360/324.11; 428/811.2; 428/811.5

(58) Field of Classification Search .................... None
See application file for complete search history.

(56) References Cited

U.S. PATENT DOCUMENTS

| | | | | |
|---|---|---|---|---|
| 5,949,623 A | * | 9/1999 | Lin ........................ | 360/324.12 |
| 6,462,919 B1 | * | 10/2002 | Mack et al. ............. | 360/327.3 |
| 7,029,771 B2 | * | 4/2006 | Hasegawa et al. ....... | 428/811.5 |
| 7,045,224 B2 | * | 5/2006 | Hasegawa et al. ....... | 428/811.5 |

(Continued)

FOREIGN PATENT DOCUMENTS

JP        9-148132       6/1997

(Continued)

OTHER PUBLICATIONS

Machine Translation of JP 2000-163717 A.*

*Primary Examiner*—Kevin M. Bernatz
(74) *Attorney, Agent, or Firm*—Brinks Hofer Gilson & Lione

(57) ABSTRACT

A fixed magnetic layer contains a first magnetic layer formed on a non-magnetic metal layer. The non-magnetic metal layer is composed of an X—Mn alloy (where X is selected from Pt, Pd, Ir, Rh, Ru, Os, Ni, and Fe). While atoms forming the first magnetic layer and atoms forming the non-magnetic metal layer are being aligned with each other, strains are generated in the individual crystal structures. By generating the strain in the crystal structure of the first magnetic layer, the magnetostriction constant $\lambda$ is increased. As a result, a magnetic sensor having a large magnetoelastic effect can be provided.

45 Claims, 11 Drawing Sheets

U.S. PATENT DOCUMENTS

| | | | |
|---|---|---|---|
| 2001/0014000 A1* | 8/2001 | Tanaka et al. | 360/324.12 |
| 2002/0009616 A1* | 1/2002 | Kamiguchi et al. | 428/692 |
| 2002/0154452 A1* | 10/2002 | Gill | 360/321 |
| 2003/0128483 A1* | 7/2003 | Kamijo | 360/324.11 |
| 2003/0179516 A1* | 9/2003 | Freitag et al. | 360/324.11 |

FOREIGN PATENT DOCUMENTS

| | | |
|---|---|---|
| JP | 2000-20926 | 1/2000 |
| JP | 2000-057537 | 2/2000 |
| JP | 2000-113418 | 4/2000 |
| JP | 2000-163717 A * | 6/2000 |
| JP | 2000-173021 | 6/2000 |
| JP | 2002-94141 | 3/2002 |

* cited by examiner

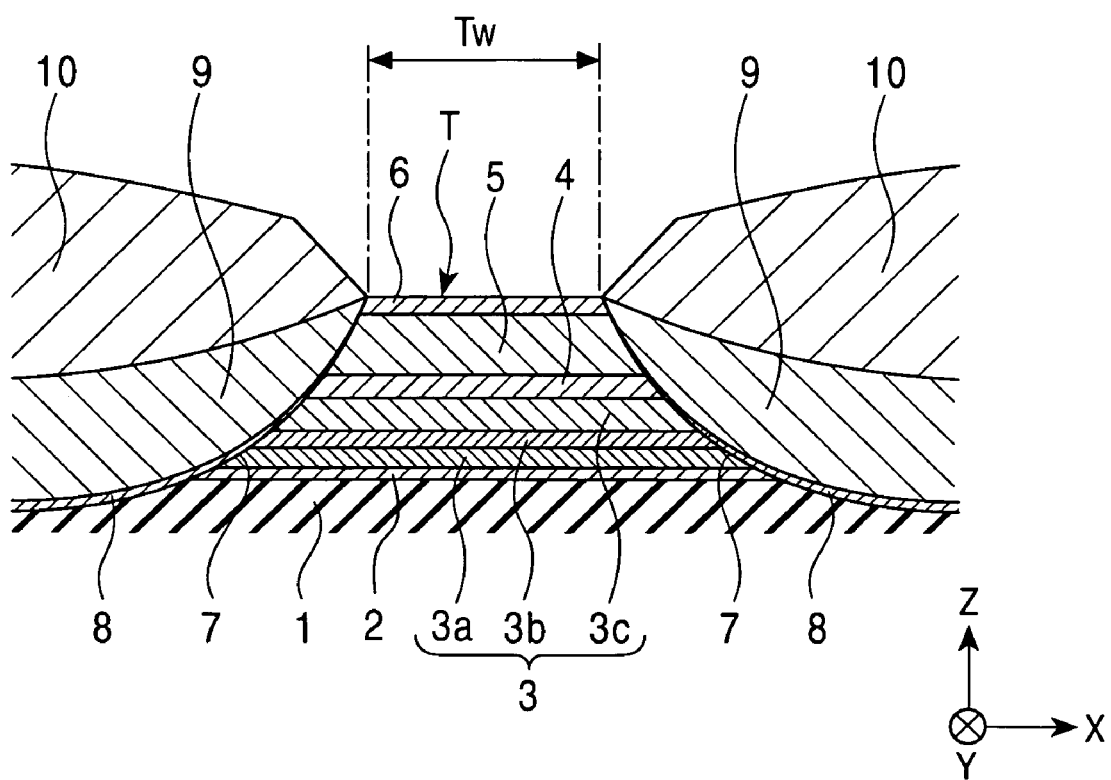

SPIN-VALVE MAGNETORESISTIVE ELEMENT HAVING FIXED MAGNETIC LAYER OF EPITAXAL LAMINATE INCLUDING MAGNETIC LAYER AND NONMAGNETIC LAYER

This application is a continuation-in-part of application Ser. No.: 10/783,159 which was filed on Feb. 20, 2004 now abandoned and which claims the benefit of priority to Japanese Patent Application No.: 2003-048694, filed on Feb. 21, 2003, both of said priority applications being herein incorporated by reference in their entirety. This application also claims the benefit of priority to Japanese Patent Application No.: JP2004-049709, which was filed on Feb. 25, 2004, which is incorporated herein in its entirety.

BACKGROUND OF THE INVENTION

1. Field of the Invention

The present invention relates to magnetic sensors each having a free magnetic layer, a non-magnetic material layer, and a fixed magnetic layer, and more particularly, relates to a magnetic sensor fixing the magnetization of a fixed magnetic layer by uniaxial anisotropy thereof.

2. Description of the Related Art

Among magnetic sensors mounted in magnetic read and write devices, a spin-valve magnetic sensor exploiting a giant magnetoresistive (GMR) effect is the most widely used.

A spin-valve magnetic sensor comprises a laminate formed of a ferromagnetic film called a fixed magnetic layer and a ferromagnetic soft magnetic film called a free magnetic layer with a non-magnetic material film called a non-magnetic material layer interposed therebetween.

The magnetization of the free magnetic layer is oriented in a particular direction by a longitudinal bias magnetic field caused, for example, by hard bias layers made of a soft magnetic material. The magnetization direction of the free magnetic layer is sensitive and is changed by an external magnetic field supplied from a recording medium. On the other hand, the magnetization of the fixed magnetic layer is fixed in a direction intersecting the magnetization direction of the free magnetic layer.

Electrical resistance is changed by the relationship between the fixed magnetization direction of the fixed magnetic layer and the change in magnetization direction of the free magnetic layer. Using the change in voltage or change in current caused by this change in electrical resistance, a leak magnetic field from a recording medium may be detected.

Heretofore, the fixed magnetic layer is formed on an antiferromagnetic layer made of an antiferromagnetic material such as PtMn so that an exchange coupling magnetic field is generated therebetween, thereby fixing the magnetization of the fixed magnetic layer.

The exchange coupling magnetic field generated at an interface between the antiferromagnetic layer and the fixed magnetic layer can be sufficiently increased so as to prevent the change in magnetization direction of the fixed magnetic layer caused by a magnetic field applied in a production process or a leak magnetic field from a recording medium. In addition, since the antiferromagnetic layer itself generates no magnetic field outside, the magnetic sensor may be designed easily.

However, in order to generate a sufficiently large exchange coupling magnetic field at the interface between the antiferromagnetic layer and the fixed magnetic layer, the antiferromagnetic layer must have a thickness of approximately 200 Å.

An antiferromagnetic layer having a large thickness present in a laminate forming a magnetic sensor primarily causes a shunt loss in a sense current. In order to increase the recording density of a recording medium, the output of the magnetic sensor must be improved. However, the shunt loss described above causes deterioration in the magnetic sensor output, thereby inhibiting such an improvement.

In addition, for efficiently reading a record signal to be detected, shield layers each formed of a soft magnetic material are provided at a top and a bottom side of a magnetic sensor. To increase the recording density of the recording medium, it is necessary to decrease the distance between the top and the bottom shield layers. However, the large thickness of the structure due to the presence of the thick antiferromagnetic layer makes it difficult to decrease the distance between the top and the bottom shield layers.

Accordingly, as shown in FIG. 17, a magnetic sensor has been proposed in which an antiferromagnetic layer is not formed and in which the magnetization of a fixed magnetic layer is fixed by uniaxial anisotropy thereof.

In the magnetic sensor shown in FIG. 17, on a lower gap layer 1 made of an insulating material such as alumina, a multilayer film T is provided which is composed of an underlying layer 2; a fixed magnetic layer 3 having a synthetic ferrimagnetic structure composed of a first magnetic layer 3a and a second magnetic layer 3c with a non-magnetic interlayer 3b interposed therebetween; a non-magnetic material layer 4; a free magnetic layer 5; and a protective layer 6 in that order from the bottom side. In addition, on two sides 7 of the multilayer film T, bias underlying layers 8, hard bias layers 9, and electrode layers 10 are formed.

In the magnetic sensor shown in FIG. 17, an antiferromagnetic layer is not provided on the fixed magnetic layer 3, and by the uniaxial anisotropy of the fixed magnetic layer 3 itself, the magnetization thereof is fixed in a Y direction in the figure. Accordingly, since the shunt loss can be decreased as compared to that of a related magnetic sensor provided with an antiferromagnetic layer, a magnetic field detection output of the magnetic sensor can be improved by 20% to 30%. In addition, since the distance between the shield layers provided at the top and the bottom sides of the magnetic sensor can be decreased, the recording density of a recording medium can be increased.

A magnetic sensor as shown in FIG. 17 has been disclosed in Japanese Unexamined Patent Application Publication No. 8-7235 (pp. 8 and 9, and FIG. 5) and Japanese Unexamined Patent Application Publication No. 2000-113418 (pp. 7 and 8, and FIGS. 4 to 7)

In the magnetic sensor disclosed in Japanese Unexamined Patent Application Publication No. 8-7235, on a buffer layer 62 of tantalum used as an underlayer, a pinned ferromagnetic layer 70 is provided. The pinned ferromagnetic layer 70 is a laminate composed of a first cobalt (Co) film 72 and a second cobalt (Co) film 74 with a ruthenium (Ru) film 73 interposed therebetween. The magnetizations of the first cobalt (Co) film 72 and the second cobalt (Co) film 74 are fixed by respective anisotropic magnetic fields thereof. The first cobalt (Co) film 72 and the second cobalt (Co) film 74 are antiferromagnetically coupled with each other and are magnetized antiparallel to each other.

However, it was found that, in the structure as that disclosed in Japanese Unexamined Patent Application Publication No. 8-7235 in which the Co films are provided on the buffer layer made of tantalum, the magnetization direction of the pinned ferromagnetic layer 70 cannot be appropriately fixed. This fact has also been disclosed in Japanese Unexamined Patent Application Publication No. 2000-113418.

The magnetic sensor disclosed in Japanese Unexamined Patent Application Publication No. 2000-113418 was made in order to solve the problem of Japanese Unexamined Patent Application Publication No. 8-7235. In this magnetic sensor, ferromagnetic films of a laminated ferrimagnetic fixed layer are formed using CoFe or CoFeNi, thereby improving the induced anisotropy.

In Japanese Unexamined Patent Application Publication No. 2000-113418, the structure in which an underlying layer made of tantalum (Ta) is provided under the laminated ferrimagnetic fixed layer is also described; however, according to experimental results (FIGS. 4 to 7 in Japanese Unexamined Patent Application Publication No. 2000-113418) obtained with and without the use of the Ta underlying layer, it has been shown that when a CoFe alloy is used for the ferromagnetic layer, the change in magnetoresistance and the coercive force are increased when the Ta underlying layer is not provided.

In order to increase the induced anisotropy of the laminated ferrimagnetic fixed layer, the use of a CoFe alloy for the ferromagnetic film and the use of a ferromagnetic layer having a positive magnetostriction constant are disclosed in Japanese Unexamined Patent Application Publication No. 2000-113418.

One factor in fixing the magnetization of a self-fixed magnetic layer is the uniaxial anisotropy derived from the magnetoelastic energy of the fixed magnetic layer. In particular, it is useful to optimize the magnetostriction of the fixed magnetic layer. However, in Japanese Unexamined Patent Application Publication No. 2000-113418, a mechanism for optimizing the magnetostriction of the fixed magnetic layer has not been discussed, nor has a particular structure for optimizing the magnetostriction of the fixed magnetic layer been described. In addition, when the coercive force of the fixed magnetic layer can be increased besides the increase in magnetostriction, it is more preferable. When the coercive force is small, since the magnetization of the fixed magnetic layer fixed in a height direction is liable to be reversed by a mechanical stress (generated when a magnetic sensor impinges upon a surface of a recording medium or generated in manufacturing), reproduction properties become unstable, resulting in degradation in reliability.

SUMMARY OF THE INVENTION

A magnetic sensor having a self-fixed magnetic layer and a mechanism of controlling the magnetostriction of the fixed magnetic layer are disclosed to appropriately control the magnetostriction. By exploiting the mechanism described above, a magnetic sensor which can tightly fix the magnetization of a fixed magnetic layer can be provided by appropriately selecting a material for a non-magnetic film which is in contact with the fixed magnetic layer.

A magnetic sensor of the present invention comprises a fixed magnetic layer, a free magnetic layer laminated thereto, a non-magnetic material layer interposed between the fixed magnetic layer and the free magnetic layer, and a non-magnetic metal layer composed of a platinum-manganese (PtMn) alloy or an X—Mn alloy (where X is at least one selected from the group consisting of platinum (Pt), palladium (Pd), iridium (Ir), rhodium (Rh), ruthenium (Ru), osmium (Os), nickel (Ni), and iron (Fe)). In the magnetic sensor described above, the fixed magnetic layer is a laminate comprising a plurality of magnetic layers with a non-magnetic interlayer interposed therebetween, a first magnetic layer among the plurality of magnetic layers, which is provided at a position farthest from the non-magnetic material layer, is in contact with the non-magnetic metal layer, a crystal of the non-magnetic metal layer and a crystal of the first magnetic layer are placed in an epitaxial state or a heteroepitaxial state, and the fixed magnetic layer has an open end surface at a face opposing a recording medium.

An epitaxial state is a state in which the types of crystal lattice (e.g. fcc, bcc, hcp) of the nonmagnetic metal layer and the first magnetic layer are the same and the atoms are substantially aligned, albeit the crystal is deformed at the boundary due to the difference in lattice constants of the different materials. Conversely, a heteroepitaxial state is a state in which the types of crystal lattice of the nonmagnetic metal layer and the first magnetic layer are different while the atoms are substantially aligned and the crystals are deformed, as in the epitaxial state. A non-epitaxial state is a state in which dislocations of the crystal at the boundary relieve strain at the boundary and the atoms are not substantially aligned, no matter whether the crystal lattice types of the nonmagnetic metal layer and the first magnetic layer are the same or different.

The fixed magnetic sensor of the present invention is a magnetic sensor in which the magnetization of the fixed magnetic layer is fixed by the uniaxial anisotropy thereof (hereinafter, this magnetic sensor is referred to as a "self-fixed type magnetic sensor" in some cases).

Accordingly, since the shunt loss can be decreased as compared to that of a magnetic sensor composed of an antiferromagnetic layer having a large thickness of about 200 Å, the magnetic field detection output of a magnetic sensor can be improved by 20% to 30%. In addition, the distance between shield layers provided at a top and a bottom side of the magnetic sensor is decreased, which allows an even higher recording density recording medium to be achieved.

Factors that determine a magnetic anisotropic magnetic field of a ferromagnetic film include the crystal magnetic anisotropy, induced magnetic anisotropy, and a magnetoelastic effect. Among these, in a film having a polycrystalline structure in which crystal grains are randomly oriented, it is difficult to obtain uniaxial anisotropy using the crystal magnetic anisotropy. On the other hand, when a magnetic field is applied to a film in one direction when it is formed or is processed by heat treatment, the uniaxial anisotropy is obtained from the induced magnetic anisotropy, and when a uniaxial stress is applied, due to the magnetoelastic effect, the uniaxial anisotropy is obtained.

Of the induced magnetic anisotropy and the magnetoelastic effect, which determine the uniaxial anisotropy fixing the magnetization of the fixed magnetic layer, the magnetoelastic effect is exploited in the present invention.

The magnetoelastic effect is controlled by the magnetoelastic energy. The magnetoelastic energy is defined by a stress applied to the fixed magnetic layer and the magnetostriction constant thereof.

In the present invention, since the end surface of the fixed magnetic layer at a face opposing a recording medium is open, the symmetry of stresses is no longer maintained, and as a result, a tensile stress is applied to the fixed magnetic layer in a height direction (the direction normal to the opposing face mentioned above) of the sensor.

In the present invention, the magnetoelastic energy is increased by increasing the magnetostriction constant of the fixed magnetic layer, and in accordance with this increase, the uniaxial anisotropy of the fixed magnetic layer is enhanced. When the uniaxial anisotropy of the fixed magnetic layer is enhanced, since the magnetization of the fixed magnetic layer is tightly fixed in a predetermined direction, the output of the magnetic sensor is increased, and the stability and the symmetry of the output are also improved.

In particular, since the first magnetic layer among the plurality of magnetic layers forming the fixed magnetic layer described above is in contact with the non-magnetic metal layer so as to form an epitaxial or a heteroepitaxial state, the non-magnetic metal layer being composed of an X—Mn alloy (where X is at least one selected from the group consisting of Pt, Pd, Ir, Rh, Ru, Os, Ni, and Fe), a strain is generated in the first magnetic layer, and hence the magnetostriction constant $\lambda$ of the first magnetic layer is increased. Accordingly, the magnetostriction constant of the fixed magnetic layer described above can be increased.

As a second aspect of the present invention, there is provide a magnetic sensor comprising: a fixed magnetic layer; a free magnetic layer laminated thereto; a non-magnetic material layer interposed between the fixed magnetic layer and the free magnetic layer; and an antiferromagnetic layer composed of an X—Mn alloy (where X is at least one selected from the group consisting of Pt, Pd, Ir, Rh, Ru, Os, Ni, and Fe). In the magnetic sensor described above, the fixed magnetic layer is a laminate comprising a plurality of magnetic layers and a non-magnetic interlayer interposed therebetween, a first magnetic layer among said plurality of magnetic layers, which is provided at a position farthest from the non-magnetic material layer, is in contact with the antiferromagnetic layer, the antiferromagnetic layer does not generates a uniaxial exchange coupling magnetic field (Hex) with the first magnetic layer, a crystal of the antiferromagnetic layer and at least a part of a crystal of the first magnetic layer are placed in an epitaxial state or a heteroepitaxial state, and the fixed magnetic layer has an open end surface at a face opposing a recording medium.

According to the above magnetic sensor of the present invention, the antiferromagnetic layer is formed so as to be in contact with the first magnetic layer. Although an antiferromagnetic exchange coupling is generated between the first magnetic layer and the antiferromagnetic layer, the uniaxial exchange coupling magnetic field (Hex) is not generated. The reason for this is that although the crystal of the antiferromagnetic layer and the crystal of the first magnetic layer are being exchange-coupled, concomitant with the rotation of the spin of the first magnetic layer, the spin of the antiferromagnetic layer also rotates, and hence due to the influence of the crystal magnetic anisotropy of the antiferromagnetic layer, the anisotropic dispersion occurs in the fixed magnetic layer.

According to the above magnetic sensor of the present invention, in addition to the increase in magnetostriction of the fixed magnetic layer, since the anisotropic dispersion occurs in the first magnetic layer due to the influence of the antiferromagnetic layer, the coercive force Hc can also be increased. Hence, besides the increase in magnetoelastic energy, a practical crystal magnetic anisotropy can also be increased, and as a result, the uniaxial anisotropy or the hard magnetic properties of the fixed magnetic layer can be effectively increased.

In addition, the thickness of the non-magnetic metal layer or the antiferromagnetic layer is preferably in the range of from 5 to 50 Å. When the thickness is set in the range described above, the magnetostriction of the fixed magnetic layer can be increased, and in addition, the shunt loss can be appropriately decreased, thereby improving the reproduction output.

In addition, the thickness of the antiferromagnetic layer is preferably in the range of from about 5 to about 18 Å. According to the experiment which will be described later, besides the increase in coercive force of the fixed magnetic layer, the rate of PLR (Pinned Layer Reversal) generation and the rate of baseline-noise generation can be appropriately decreased.

Furthermore, according to the present invention, the thickness of the antiferromagnetic layer is preferably in the range of from about 14 to about 18 Å. Accordingly, the coercive force of the fixed magnetic layer can be more effectively increased, and in addition, the rate of PLR generation can be more appropriately decreased.

As a third aspect of the present invention, there is provided a magnetic sensor comprising: a fixed magnetic layer; a free magnetic layer laminated thereto; a non-magnetic material layer interposed between the fixed magnetic layer and the free magnetic layer; and an antiferromagnetic layer composed of an X—Mn alloy (where X is at least one selected from the group consisting of Pt, Pd, Ir, Rh, Ru, Os, Ni, and Fe) and having a thickness in the range of from about 5 to about 18 Å. In the magnetic sensor described above, the fixed magnetic layer is a laminate comprising a plurality of magnetic layers and a non-magnetic interlayer interposed therebetween, a first magnetic layer among said plurality of magnetic layers, which is provided at a position farthest from the non-magnetic material layer, is in contact with the antiferromagnetic layer, a crystal of the antiferromagnetic layer and at least a part of a crystal of the first magnetic layer are placed in an epitaxial state or a heteroepitaxial state, and the fixed magnetic layer has an open end surface at a face opposing a recording medium.

According to the above magnetic sensor of the present invention, the antiferromagnetic layer is in contact with the first magnetic layer. Since the antiferromagnetic layer has a small thickness, a force for holding the spin by the crystal magnetic anisotropy of the antiferromagnetic layer is small, and the uniaxial exchange coupling is not strong; hence, the anisotropic dispersion occurs in the first magnetic layer.

According to the present invention, the magnetostriction of the fixed magnetic layer can be increased, and at the same time, due to the anisotropic dispersion of the first magnetic layer, the coercive force Hc can be increased. Hence, besides the increase in magnetoelastic energy, a practical crystal magnetic anisotropy can also be increased, and as a result, the uniaxial anisotropy or the hard magnetic properties of the fixed magnetic layer can be effectively increased.

In addition, the thickness of the antiferromagnetic layer is preferably in the range of from about 14 to about 18 Å. Accordingly, the coercive force of the fixed magnetic layer can be more effectively increased, and in addition, the rate of baseline-noise generation and the rate of PLR generation can be appropriately decreased.

In addition, according to the present invention, the antiferromagnetic layer preferably comprises IrMn, RuMn, or RhMn. These materials each form an irregular phase antiferromagnetic layer, and the Neel temperature thereof is room temperature or more.

In the antiferromagnetic layer described above, the composition ratio of the element other than Mn is preferably in the range of from about 15 to about 29 atomic percent. Accordingly, the magnetostriction and the coercive force of the fixed magnetic layer can be increased at the same time.

In addition, when the X element content of the X—Mn alloy is about 45 to about 99 atomic percent, it is preferable since the magnetostriction of the fixed magnetic layer can be increased.

In addition, even when the Pt content is 100 atomic percent, the magnetostriction can be increased. However, when the Pt content is 100 atomic percent, since the electrical resistance is decreased, the shunt loss of a sense current is increased, and hence the output is liable to be decreased. Accordingly, by adding about one atomic percent of Mn or more, the specific resistance is preferably increased.

In the present invention, when the non-magnetic metal layer or the antiferromagnetic layer is formed of the X—Mn alloy (where X is at least one selected from the group consisting of Pt, Pd, Ir, Rh, Ru, Os, Ni, and Fe), the non-magnetic metal layer or the antiferromagnetic layer may have a face-centered cubic (fcc) structure in the entire region thereof or in the vicinity of an interface at the first magnetic layer side of the fixed magnetic layer, and when an appropriate seed layer such as NiFeCr is disposed under the non-magnetic metal layer, equivalent crystal planes represented by the {111} plane are preferentially oriented in the direction parallel to the interface.

The magnetic sensor of the present invention may further comprise bias layers on two side portions of the free magnetic layer and fixed magnetic layer, which bias layers supply a longitudinal bias magnetic field to the free magnetic layer.

In the present invention, the first magnetic layer of the fixed magnetic layer may have a face-centered cubic (fcc) structure in the entire region thereof or in the vicinity of an interface at the non-magnetic metal layer side, and it is preferable that equivalent crystal planes represented by the {111} plane be preferentially oriented in the direction parallel to the interface.

As described above, the non-magnetic metal layer of the present invention has a face-centered cubic (fcc) structure in which equivalent crystal planes represented by the {111} plane are preferentially oriented in the direction parallel to the interface.

Hence, when the first magnetic layer has a face-centered cubic (fcc) structure in which equivalent crystal planes represented by the {111} plane are preferentially oriented in the direction parallel to the interface, atoms forming the first magnetic layer and atoms forming the non-magnetic metal layer are likely to be aligned with each other.

However, since the nearest interatomic distance of the first magnetic layer in the {111} plane differs from that of the non-magnetic metal layer in the {111} plane by a certain value or more, in the vicinity of the interface between the first magnetic layer and the non-magnetic metal layer, while the atoms forming the first magnetic layer and the atoms forming the non-magnetic metal layer are being aligned with each other, strains are generated in the individual crystal structures. That is, by generating the strain in the crystal structure of the first magnetic layer, the magnetostriction constant $\lambda$ can be increased.

For example, when composed of Co or $Co_xFe_y$ (where $y \leq 20$ and $x+y=100$ are satisfied), the first magnetic layer of the fixed magnetic layer may have a face-centered cubic (fcc) structure in which equivalent planes represented by the {111} plane are preferentially oriented in the direction parallel to the interface.

Alternatively, the first magnetic layer of the fixed magnetic layer may have a body-centered cubic (bcc) structure in the entire region thereof or in the vicinity of the interface at the non-magnetic metal layer side, and it is preferable that equivalent crystal planes represented by the {110} plane be preferentially oriented in the direction parallel to the interface.

Even when the first magnetic layer has a bcc structure in which equivalent crystal planes represented by the {110} plane are preferentially oriented in the direction parallel to the interface, the atoms forming the first magnetic layer and the atoms forming the non-magnetic metal layer become likely to be aligned with each other.

As is the case described above, since the nearest interatomic distance of the first magnetic layer in the {110} plane differs from that of the non-magnetic metal layer in the {111} plane by a certain value or more, in the vicinity of the interface between the first magnetic layer and the non-magnetic metal layer, while the atoms forming the first magnetic layer and the atoms forming the non-magnetic metal layer are being aligned with each other, strains are generated in the individual crystal structures. That is, by generating the strain in the crystal structure of the first magnetic layer, the magnetostriction constant $\lambda$ can be increased.

For example, when composed of $Co_xFe_y$ (where $y \leq 20$ and $x+y=100$ are satisfied, and x and y are on an atomic percent basis), the first magnetic layer of the fixed magnetic layer may have a body-centered cubic (bcc) structure in which equivalent planes represented by the {110} plane are preferentially oriented in the direction parallel to the interface.

In addition, compared to Co or $Co_xFe_y$ (where $y \leq 20$ and $x+y=100$ are satisfied) having an fcc structure, $Co_xFe_y$ (where $y \geq 20$ and $x+y=100$ are satisfied) having a bcc structure has a large magnetostriction constant $\lambda$ particularly at a composition in which y is approximately 50, and hence a larger magnetoelastic effect can be obtained. In addition, $Co_xFe_y$ (where $y \geq 20$ and $x+y=100$ are satisfied) having a bcc structure has a large coercive force, and hence the magnetization of the fixed magnetic layer can be tightly fixed.

In addition, in the present invention, the first magnetic layer of the fixed magnetic layer in the vicinity of the interface at the non-magnetic metal layer side has a face-centered cubic (fcc) structure in which equivalent crystal planes represented by the {111} plane are oriented in the direction parallel to the interface at the non-magnetic metal layer side, and the first magnetic layer in the vicinity of the interface at the non-magnetic interlayer side also has a body-centered cubic (bcc) structure in which equivalent crystal planes represented by the {110} plane are oriented in the direction parallel to the interface at the non-magnetic interlayer side.

When the first magnetic layer is formed to have a bcc structure in the vicinity of the interface at the non-magnetic interlayer side, the magnetostriction constant $\lambda$ can be increased, and hence a large magnetoelastic effect can be obtained. On the other hand, when the first magnetic layer is formed to have an fcc structure in the vicinity of the interface at the non-magnetic metal layer side, crystal orientations of the fixed magnetic layer, the non-magnetic material layer, and the free magnetic layer are likely to become uniform, and hence the rate (MR rate) of change in magnetoresistance can be increased.

For example, when the first magnetic layer of the fixed magnetic layer comprises $Co_xFe_y$ (where $y \leq 20$ and $x+y=100$ are satisfied) or Co in the vicinity of the interface at the non-magnetic metal layer side and comprises $Co_xFe_y$ (where $y \geq 20$ and $x+y=100$ are satisfied) in the vicinity of the interface at the non-magnetic interlayer side, an fcc structure can be formed in the vicinity of the interface at the non-magnetic metal layer side, in which equivalent planes represented by a {111} plane are oriented in the direction parallel to the interface, and a bcc structure can be formed in the vicinity of the interface at the non-magnetic interlayer side, in which equivalent planes represented by a {110} plane are oriented in the direction parallel to the interface.

In addition, if the first magnetic layer of the fixed magnetic layer comprises $Co_xFe_y$ (where $y \geq 20$ and $x+y=100$ are satisfied) in the vicinity of the interface at the non-magnetic interlayer side, the RKKY interaction between the first magnetic layer and the other magnetic layer with the non-magnetic interlayer interposed therebetween is enhanced.

In the first magnetic layer of the fixed magnetic layer, the Fe content may be gradually increased from the interface at the non-magnetic metal layer side to that at the non-magnetic interlayer side.

According to the present invention, in order to generate the strain in the crystal structure while the atoms forming the non-magnetic metal layer and the atoms forming the first magnetic layer are being aligned with each other, the difference in nearest interatomic distance between the non-magnetic metal layer and the first magnetic layer of the fixed magnetic layer in a plane parallel to the interface therebetween divided by the nearest interatomic distance of the first magnetic layer is in the range of from 0.05 to 0.20.

In addition, the first magnetic layer comprises a magnetic material having a positive magnetostriction constant.

When the magnetic sensor of the present invention further contains electrode layers composed of a film of chromium (Cr), α-Ta, or Rh on side portions of the free magnetic layer, the non-magnetic material layer, and the fixed magnetic layer, a compressive stress applied to the fixed magnetic layer in a track width direction (that is, a tensile stress in the height direction) can be increased.

When a film of Cr, α-Ta, or Rh is used as described above, the spacing of the crystal lattice of the electrode layers in the direction parallel to a surface of the film is 0.2044 nm or more (the {110} spacing of a bcc structure), 0.2337 nm or more (the {110} spacing of a bcc structure), or 0.2200 nm or more (the {111} spacing of an fcc structure), respectively.

In particular, the present invention can be used to miniaturize the magnetic sensor, and the fixed magnetic layer more has an optical track width dimension of about 0.15 μm or less.

BRIEF DESCRIPTION OF THE DRAWINGS

FIG. 17 is a cross-sectional view showing a related magnetic sensor when viewed from a face opposing a recording medium.

DESCRIPTION OF THE PREFERRED EMBODIMENTS

Figure 1:
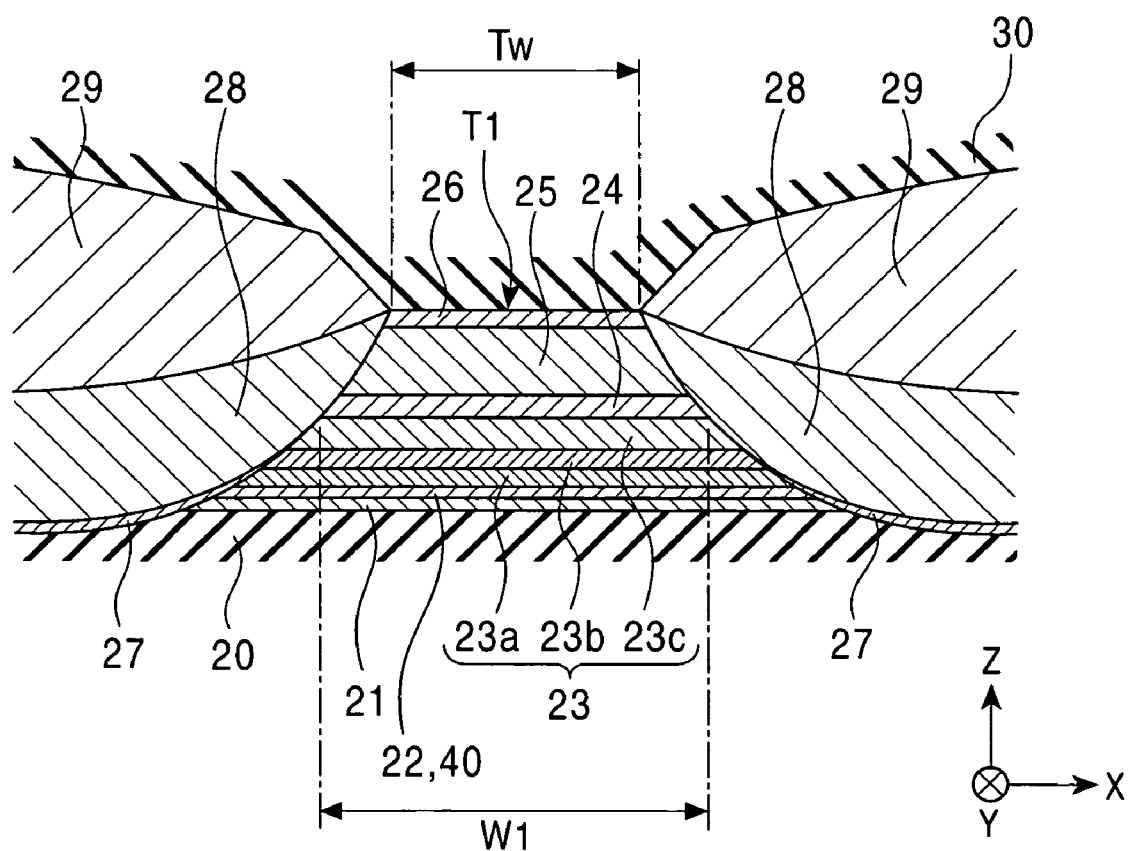
FIG. 1 is a cross-sectional view of the structure of a magnetic sensor according to a first embodiment of the present invention, when it is viewed from a face opposing a recording medium.

FIG. 1 is a cross-sectional view of a magnetic sensor of a first embodiment according to the present invention, when it is viewed from a face opposing a recording medium.

In the magnetic sensor shown in FIG. 1, a multilayer film T1 is formed on a lower gap layer 20 made of an insulating material such as alumina.

In the embodiment shown in FIG. 1, the multilayer film T1 is formed of a seed layer 21, a non-magnetic metal layer 22, a fixed magnetic layer 23, a non-magnetic material layer 24, a free magnetic layer 25, and a protective layer 26 laminated to each other in that order from the bottom.

The seed layer 21 is formed of an NiFe alloy, an NiFeCr alloy, Cr, Ta, or the like. The seed layer 21 is composed, for example, of 60 atomic percent of ($Ni_{0.8}Fe_{0.2}$) and 40 atomic percent of Cr and has a thickness of 35 to 60 Å.

When the seed layer 21 is provided, the {111} orientation of the non-magnetic metal layer 22 becomes superior. The non-magnetic metal layer 22 will be described later.

The fixed magnetic layer 23 has a synthetic ferrimagnetic structure composed of a first magnetic layer 23a and a second magnetic layer 23c with a non-magnetic interlayer 23b interposed therebetween. The magnetization of the fixed magnetic layer 23 is fixed in a height direction (Y direction in the figure) by the uniaxial anisotropy thereof.

The non-magnetic material layer 24 is a layer preventing magnetic coupling between the fixed magnetic layer 23 and the free magnetic layer 25 and is formed of a non-magnetic material, such as copper (Cu), Cr, gold (Au), or silver (Ag), having electrical conductivity. In particular, Cu is used. The thickness of the non-magnetic material layer is 17 to 30 Å.

The free magnetic layer 25 is formed of a magnetic material such as an NiFe alloy or a CoFe alloy. In the embodiment shown in FIG. 1, in particular, when the free magnetic layer 25 is formed of an NiFe alloy, a diffusion blocking layer (not shown) made of Co, CoFe, or the like is formed between the free magnetic layer 25 and the non-magnetic material layer 24. The thickness of the free magnetic layer 25 is about 20 to about 60 Å. In addition, the free magnetic layer 25 may have a synthetic ferrimagnetic structure composed of a plurality of magnetic layers laminated to each other with a non-magnetic interlayer interposed therebetween.

The protective layer 26 is formed, for example, of Ta and suppresses the progress of oxidation of the multilayer film T1. The thickness of the protective layer 26 is about 10 to about 50 Å.

In the embodiment shown in FIG. 1, on the side portions of the multilayer film T1 formed of the layers from the seed layer 21 to the protective layer 26, bias underlying layers 27, hard bias layers 28, and electrode layers 29 are formed. Using a longitudinal bias magnetic field from the hard bias layers 28, the magnetization of the free magnetic layer 25 is oriented in a track width direction (X direction in the figure).

The bias underlying layers 27 are formed of Cr, tungsten (W), or titanium (Ti); the hard bias layers 28 are formed, for example, of a cobalt-platinum (Co—Pt) alloy or a cobalt-chromium-platinum (Co—Cr—Pt) alloy; and the electrode layers 29 are formed of Cr, Ta, Rh, Au, or W.

The thickness of the bias underlying layer 27 is 20 to 100 Å; the thickness of the hard bias layer 28 is about 100 to about 400 Å; and the thickness of the electrode layer 29 is about 400 to about 1,500 Å.

On the electrode layers 29 and the protective layer 26, an upper gap layer 30 made of an insulating material such as alumina is provided. Although not shown in the figure, under the lower gap layer 20, a bottom shield layer is provided, and on the upper gap layer, a top shield layer is provided. The top and the bottom shield layers are formed of a soft magnetic material such as NiFe. The thickness of each of the upper and the lower gap layers is about 50 to about 300 Å.

The magnetization of the free magnetic layer 25 is oriented in the track width direction (X direction in the figure) by the longitudinal bias magnetic field from the hard bias layers 28. In addition, with respect to a signal magnetic field (external magnetic field) from a recording medium, the magnetization of the free magnetic layer 25 is sensitive and changed in response to a relatively small signal magnetic field. On the other hand, the magnetization of the fixed magnetic layer 23 is fixed in the height direction (Y direction in the figure).

In accordance with the relationship between the change in magnetization direction of the free magnetic layer 25 and the fixed magnetization direction (in particular, fixed magnetization direction of the second magnetic layer 23c) of the fixed magnetic layer 23, the electrical resistance will be changed. The change in the electrical resistance above causes a change in voltage or in current, thereby permitting a leak magnetic field from a recording medium to be detected.

Features of this embodiment will be described.

The fixed magnetic layer 23 of the magnetic sensor shown in FIG. 1 has a synthetic ferrimagnetic structure formed of the first magnetic layer 23a and the second magnetic layer 23c with the non-magnetic interlayer 23b interposed therebetween. The magnetization of the first magnetic layer 23a and the magnetization of the second magnetic layer 23c are oriented antiparallel to each other by the RKKY interaction through the non-magnetic interlayer 23b.

The first magnetic layer 23a is disposed at a position further from the non-magnetic material layer 24 than the second magnetic layer 23c. The first magnetic layer 23a is also in contact with the non-magnetic metal layer 22.

The non-magnetic metal layer 22 is formed of an X—Mn alloy (where X is at least one element selected from the group consisting of Pt, Pd, Ir, Rh, Ru, Os, Ni, and Fe).

The thickness of the non-magnetic metal layer 22 is 5 to 50 Å.

When the non-magnetic metal layer 22 which is formed of an X—Mn alloy (where X is at least one element selected from the group consisting of Pt, Pd, Ir, Rh, Ru, Os, Ni, and Fe) has a thickness as described above, the non-magnetic metal layer 22 continuously maintains a face-centered cubic structure (fcc) which is formed during film formation. When the thickness of the non-magnetic metal layer 22 is more than 50 Å, and when a temperature of about 250° C. or more is applied thereto, the crystal structure of the non-magnetic metal layer 22 is disadvantageously transformed into a CuAuI type regular face-centered tetragonal (fct) structure. However, although the thickness of the non-magnetic metal layer 22 is more than about 50 Å, when a temperature at about 250° C. or more is not applied thereto, the crystal structure of the non-magnetic metal layer continuously maintains a face-centered cubic (fcc) structure which is formed during formation of the film.

When the non-magnetic metal layer 22, which is formed of an X—Mn alloy (where X is at least one element selected from the group consisting of Pt, Pd, Ir, Rh, Ru, Os, Ni, and Fe), has a face-centered cubic (fcc) structure, an exchange coupling magnetic field is not generated at the interface between this non-magnetic metal layer 22 and the first magnetic layer 23a, or even when generated, the exchange coupling magnetic field is extremely weak, and as a result, the magnetization direction of the first magnetic layer 23a cannot be fixed by the exchange coupling magnetic field.

Accordingly, in the magnetic sensor shown in FIG. 1, the magnetization of the fixed magnetic layer 23 is fixed by the uniaxial anisotropy thereof. The magnetic sensor shown in FIG. 1 is called a self-fixed type magnetic sensor.

The self-fixed type magnetic sensor can reduce a shunt loss as compared to that of a magnetic sensor provided with an antiferromagnetic layer having a large thickness of approximately 200 Å, and hence the magnetic field detection output of the magnetic sensor can be improved by 20% to 30%. In addition, since the distance between the shield layers provided at the top and the bottom sides of the magnetic sensor can be decreased, the trend toward higher recording density of a recording medium can also be satisfied.

In this embodiment, the thickness of the second magnetic layer 23c is larger than that of the first magnetic layer 23a. The magnetization of the second magnetic layer 23c is oriented in the height direction (Y direction in the figure), and the magnetization of the first magnetic layer 23a is fixed in the direction antiparallel to the height direction.

The thickness of the first magnetic layer 23a is about 10 to about 30 Å, and the thickness of the second magnetic layer 23c is about 15 to about 35 Å. When the thickness of the first magnetic layer 23a is increased, the coercive force is increased. However, when the thickness of the first magnetic layer 23a is increased, the shunt loss is also increased. In addition, as described later, when the first magnetic layer 23a is aligned with the non-magnetic metal layer 22, a strain is generated in the crystal structure. This strain causes the magnetostriction constant $\lambda$ and the uniaxial anisotropy to be increased. However, when the thickness of the first magnetic layer 23a is increased too much, dislocations and other defects cause the strain generated in the first magnetic layer 23a to become small. As a result, the magnetostriction constant $\lambda$ and the uniaxial anisotropy are decreased.

In the present invention, of the induced magnetic anisotropy and the magnetoelastic effect, which determine the uniaxial anisotropy fixing the magnetization of the fixed magnetic layer 23, the magnetoelastic effect is primarily exploited.

The magnetoelastic effect is controlled by the magnetoelastic energy. The magnetoelastic energy is defined by a stress $\sigma$ applied to the fixed magnetic layer 23 and the magnetostriction constant $\lambda$ thereof.

Figure 2:
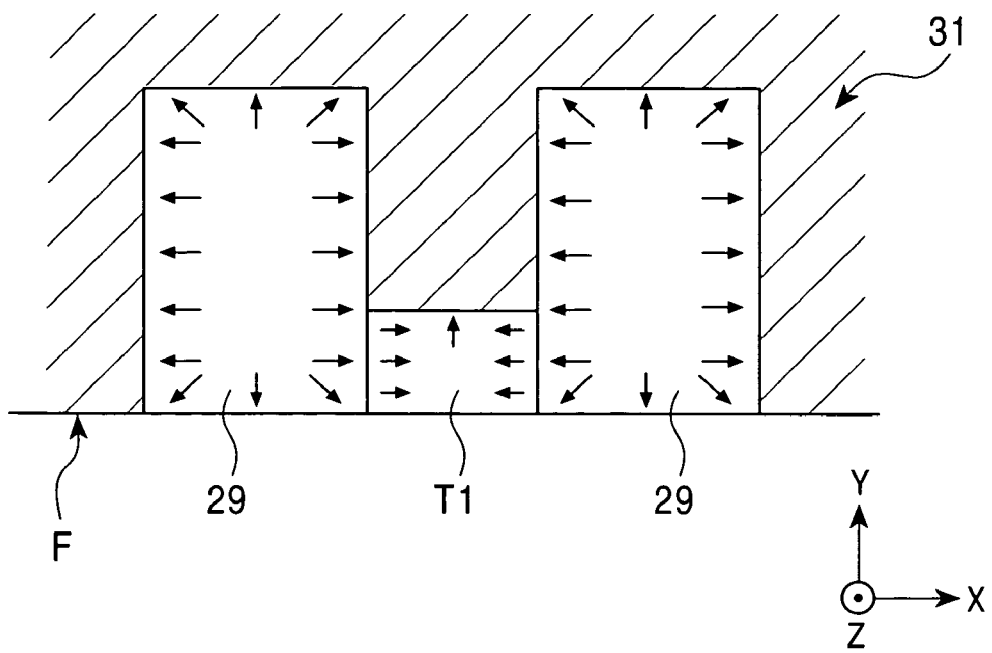
FIG. 2 is a plan view of the magnetic sensor shown in FIG. 1.

FIG. 2 is a plan view showing the magnetic sensor in FIG. 1 when it is viewed from above in the figure (along the direction opposite to the Z direction in the figure). The multilayer film T1 is formed between a pair of the bias underlying layers 27, a pair of the hard bias layers 28, and a pair of the electrode layers 29. The bias underlying layers 27 and the hard bias layers 28 are not shown in FIG. 2 as they are provided under the respective electrode layers 29. The peripheries of the multilayer film T1, the bias underlying layers 27, the hard bias layers 28, and the electrode layers 29 are covered with an insulating material layer 31 shown by oblique lines.

In addition, an end surface F located at a face opposing a recording medium (the air bearing surface, ABS), which is composed of the multilayer film T1, the bias underlying layers 27, the hard bias layers 28, and the electrode layers 29, is exposed or is covered with a protective layer of diamond-like carbon (DLC) having a small thickness of about 20 to about 50 Å, that is, the end surface F is an open end surface.

Accordingly, since the end surface F is open, the symmetry of stresses from the lower gap layer 20 and the upper gap layer 30 is destroyed, the stresses being originally isotropic in two-dimensions, and as a result, a tensile stress is applied to the multilayer film T1 in the direction parallel to the height direction (Y direction in the figure). In addition, when each laminate film formed of the bias underlying layer 27, the hard bias layer 28, and the electrode layer 29 has an internal compressive stress therein, since the electrode layer and the like tends to extend in the direction along the plane, a compressive stress parallel to the track width direction (X direction in the figure) and a compressive stress antiparallel thereto are applied to the multilayer film T1.

That is, tensile stress in the height direction and compressive stresses in the track width direction are applied to the fixed magnetic layer 23 (which is open at the end surface F located at the face opposing the recording medium). In addition, since the first magnetic layer 23a is formed of a magnetic material having a positive magnetostriction constant, the magnetoelastic effect causes the easy magnetization axis of the first magnetic layer 23a to be oriented parallel to a depth direction (height direction, Y direction in the figure) of the magnetic sensor. The magnetization direction of the first magnetic layer 23a is thus fixed in a direction parallel or antiparallel to the height direction. The magnetization of the second magnetic layer 23c is fixed in a direction antiparallel to the magnetization direction of the first magnetic layer 23a by the RKKY interaction through the non-magnetic interlayer 23b.

In the present invention, the magnetoelastic energy is increased by increasing the magnetostriction constant of the fixed magnetic layer 23, and hence the uniaxial anisotropy thereof is enhanced. When the uniaxial anisotropy of the fixed magnetic layer 23 is enhanced, the magnetization thereof is tightly fixed in a predetermined direction. This increases the output of the magnetic sensor, thereby improving the stability and the symmetry of the output.

In particular, since the first magnetic layer 23a forming the fixed magnetic layer 23 is in contact with the non-magnetic metal layer 22, a strain is generated in the crystal structure of the first magnetic layer 23a, and hence the magnetostriction constant $\lambda$ thereof is increased.

As described above, the non-magnetic metal layer 22 has an fcc structure in which equivalent crystal planes represented by the {111} plane are oriented in the direction parallel to the interface.

In addition, when formed of Co or $Co_xFe_y$ (where $y \leq 20$ and $x+y=100$ are satisfied), the first magnetic layer 23a of the fixed magnetic layer 23 has a face-centered cubic (fcc) structure. In such a first magnetic layer 23a, equivalent crystal planes represented by the {111} plane are oriented in the direction parallel to the interface. $Co_xFe_y$ where $y \leq 20$ and $x+y=100$ are satisfied and has an fcc structure will herein be referred to as fcc $Co_xFe_y$.

Accordingly, atoms forming the first magnetic layer 23a and atoms forming the non-magnetic metal layer 22 are likely to be aligned with each other, and the crystal of the non-magnetic metal layer 22 and the crystal of the fixed magnetic layer 23 are placed in an epitaxial state.

However, the nearest interatomic distance of the first magnetic layer 23a in the {111} plane must be different from that of the non-magnetic metal layer 22 in the {111} plane by at least a particular value.

In order to increase the magnetostriction constant of the first magnetic layer 23a by generating a strain in the crystal structure while the atoms forming the non-magnetic metal layer 22 and the atoms forming the first magnetic layer 23a are aligned with each other, the composition of the non-magnetic metal layer 22 is adjusted. More specifically, the X element content of the X—Mn alloy, either of which may be used as a material for the non-magnetic metal layer 22, is adjusted.

For example, when the X element content of the X—Mn alloy is set to 51 atomic percent or more, the magnetostriction of the first magnetic layer 23a aligned with the non-magnetic metal layer 22 is rapidly increased. In addition, when the X element content of the X—Mn alloy is 55 to 99 atomic percent, the magnetostriction of the first magnetic layer 23a becomes stable while having a large value.

In addition, the value (hereinafter referred to as a "mismatch value") obtained by dividing the difference between the nearest interatomic distance of the non-magnetic metal layer 22 in the {111} plane and that of the first magnetic layer 23a in the {111} plane by the nearest interatomic distance of the first magnetic layer 23a in the {111} plane is set in the range of from about 0.05 to about 0.20.

Figure 3:
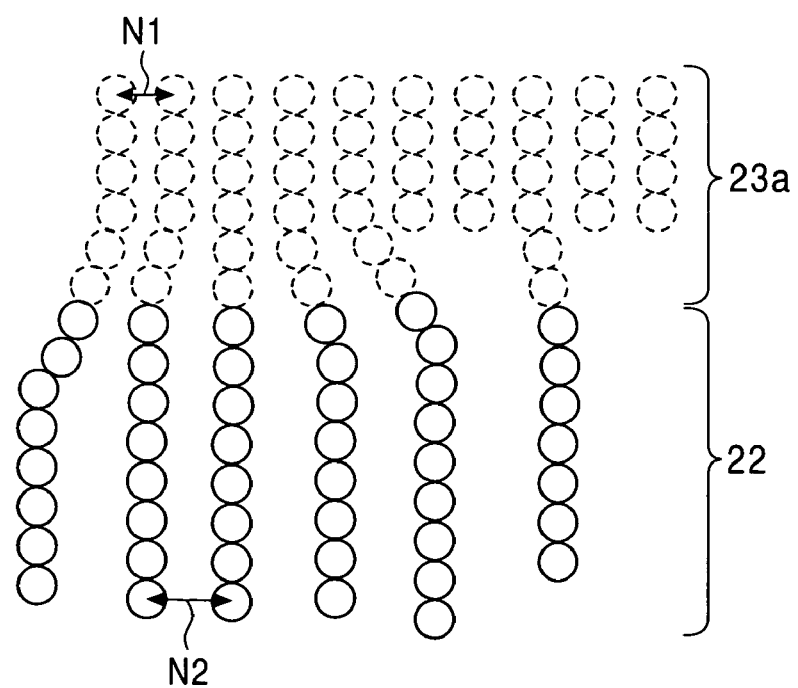
FIG. 3 is a schematic view showing the state in which strains are generated while a non-magnetic metal layer and a fixed magnetic layer are being aligned with each other.

In the magnetic sensor of this embodiment, as schematically shown in FIG. 3, while the atoms forming the non-magnetic metal layer 22 and the atoms forming the first magnetic layer 23a are being aligned with each other, strains are generated in the individual crystal structures in the vicinity of the interface therebetween.

In FIG. 3, N1 indicates the nearest interatomic distance of the first magnetic layer 23a in the {111} plane, and N2 indicates the nearest interatomic distance of the non-magnetic metal layer 22 in the {111} plane. N1 and N2 are each measured at a place located far enough from the interface between the non-magnetic metal layer 22 and the first magnetic layer 23a so that the influence of the strain is not significant.

As described above, when a strain is generated in the crystal structure of the first magnetic layer 23a, the magnetostriction constant λ thereof can be increased, and as a result, a large magnetoelastic effect can be obtained.

Figure 4:
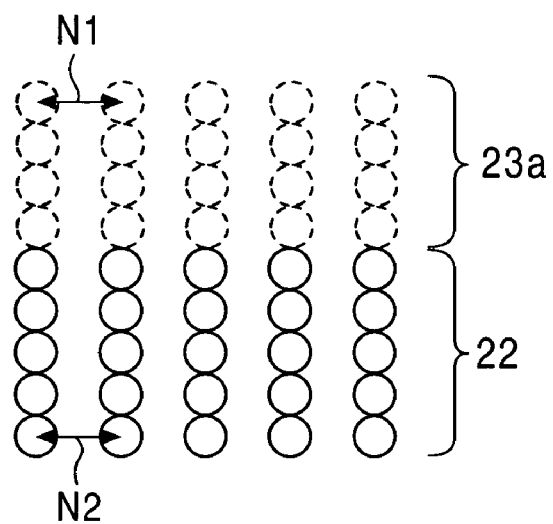
FIG. 4 is a schematic view showing the state in which a non-magnetic metal layer and a fixed magnetic layer are aligned with each other.

As schematically shown in FIG. 4, when the atoms of the non-magnetic metal layer 22 and the atoms of the first magnetic layer 23a are aligned with each other and the mismatch value between the non-magnetic metal layer 22 and the first magnetic layer 23a is too small, strains are not generated in the individual crystal structures in the vicinity of the interface therebetween. As a result, the magnetostriction constant λ of the first magnetic layer 23a is not increased.

Figure 5:
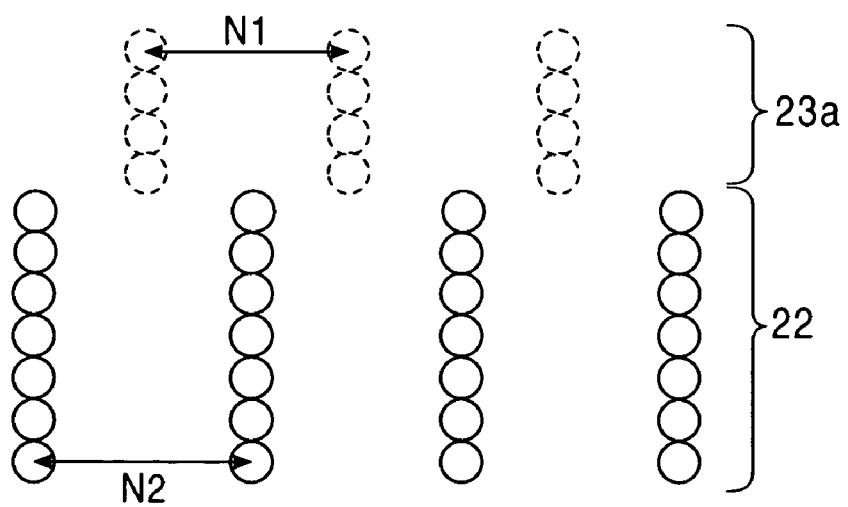
FIG. 5 is a schematic view showing the state in which a non-magnetic metal layer and a fixed magnetic layer are not aligned with each other.

On the other hand, when the mismatch value between the non-magnetic metal layer 22 and the first magnetic layer 23a is too large, as schematically shown in FIG. 5, dislocations are formed and the atoms of the non-magnetic metal layer 22 and the atoms of the first magnetic layer 23a are not aligned with each other at all. As a result, a non-aligned state (or non-epitaxial state) is formed. When the atoms of the non-magnetic metal layer 22 and the atoms of the first magnetic layer 23a are placed in a non-aligned state, similar to the case of the mismatch value being too small, strains are also not generated in the individual crystal structures in the vicinity of the interface therebetween. As a result, the magnetostriction constant λ of the first magnetic layer 23a is not increased.

In addition, the first magnetic layer 23a of the fixed magnetic layer 23 may have a body-centered cubic (bcc) structure in which equivalent crystal planes represented by the {110} plane are oriented in the direction parallel to the interface. For example, when formed of $Co_xFe_y$ (where y≧20 and x+y=100 are satisfied), the first magnetic layer 23a of the fixed magnetic layer 23 has a body-centered cubic (bcc) structure. $Co_xFe_y$ where y≧20 and x+y=100 are satisfied and has a bcc structure will herein be referred to as bcc $Co_xFe_y$.

As described above, the non-magnetic metal layer 22 has an fcc structure in which equivalent crystal planes represented by the {111} plane are oriented in the direction parallel to the interface.

The atomic arrangement of a crystal having a bcc structure in equivalent crystal planes represented by the {110} plane is similar to the atomic arrangement of a crystal having an fcc structure in equivalent crystal planes represented by the {111} plane, and hence the crystal having a bcc structure and the crystal having an fcc structure can be placed in an aligned state, that is, in a so-called heteroepitaxial state in which the individual atoms are aligned with each other.

In addition, the nearest interatomic distance of the first magnetic layer 23a in the {110} plane is different from that of the non-magnetic metal layer 22 in the {111} plane by at least the particular value. Hence, in the vicinity of the interface between the first magnetic layer 23a and the non-magnetic metal layer 22, while the atoms forming the first magnetic layer 23a and the atoms forming the non-magnetic metal layer 22 are being aligned with each other, strains are generated in the individual crystal structures. Hence, by generating a strain in the crystal structure of the first magnetic layer 23a, the magnetostriction constant λ thereof can be increased.

In addition, compared to Co (which has an fcc structure or fcc $Co_xFe_y$, bcc $Co_xFe_y$ has a large magnetostriction constant λ, particularly at a composition in which Y is approximately 50, and hence a larger magnetoelastic effect can be obtained. In addition, bcc $Co_xFe_y$ has a large coercive force, and hence the magnetization of the fixed magnetic layer 23 can be tightly fixed.

In the present invention, in the vicinity of the interface between the first magnetic layer 23a and the non-magnetic metal layer 22, the atoms forming the first magnetic layer 23a and the atoms forming the non-magnetic metal layer 22 may be mostly aligned with each other to form an aligned state. For example, as schematically shown in FIG. 3, there may be some regions in which some atoms forming the first magnetic layer 23a and some atoms forming the non-magnetic metal layer 22 are not aligned with each other.

In addition, as a material for the second magnetic layer 23c, either bcc $Co_xFe_y$ or Co or fcc $Co_xFe_y$ may be used. When bcc $Co_xFe_y$ is used as a material for the second magnetic layer 23c, positive magnetostriction can be increased. Bcc $Co_xFe_y$ has a large coercive force and can tightly fix the magnetization of the fixed magnetic layer 23. In addition, the RKKY interaction between the first magnetic layer 23a and the second magnetic layer 23c with the non-magnetic interlayer 23b interposed therebetween is enhanced.

On the other hand, since being in contact with the non-magnetic material layer 24 and having a significant influence on the magnetoresistive effect, when the second magnetic layer 23c is formed of Co or fcc $Co_xFe_y$, the magnetoresistive effect is unlikely to be degraded.

Figure 6:
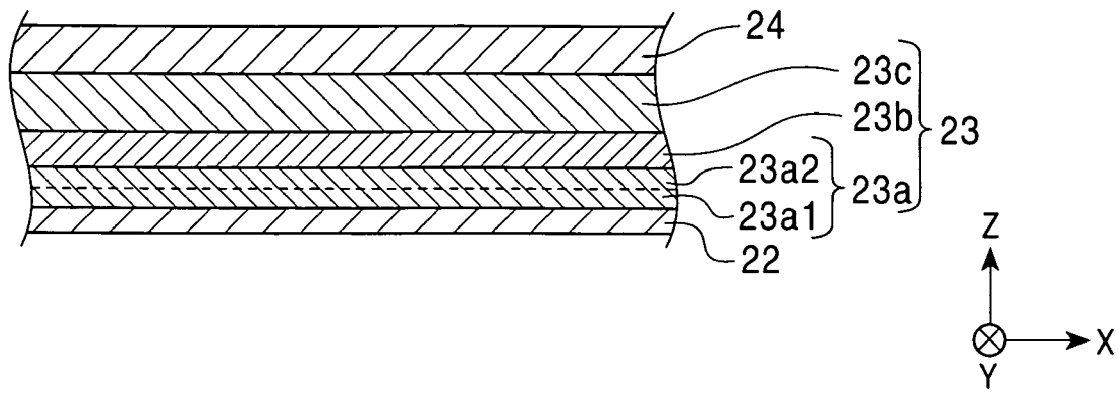
FIG. 6 is a partial cross-sectional view of a fixed magnetic layer and its vicinity of a magnetic sensor of the present invention.
Figure 7:
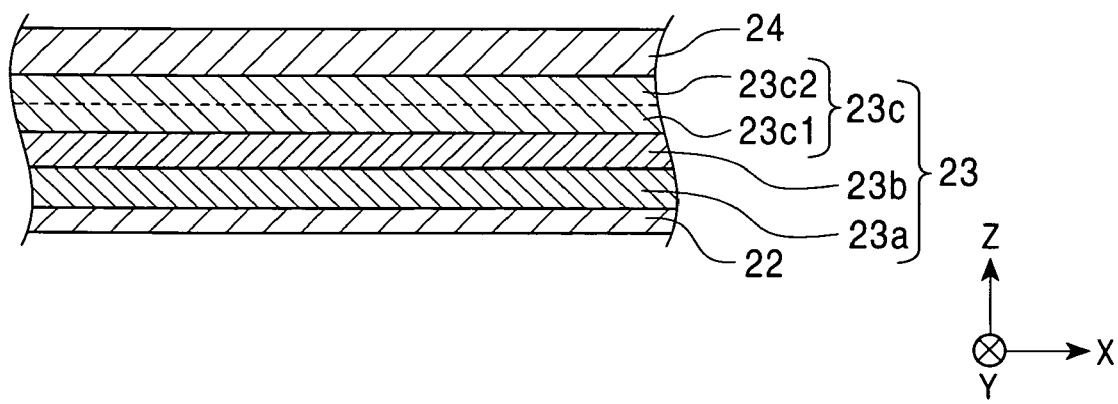
FIG. 7 is a partial cross-sectional view of a fixed magnetic layer and its vicinity of a magnetic sensor of the present invention.
Figure 8:
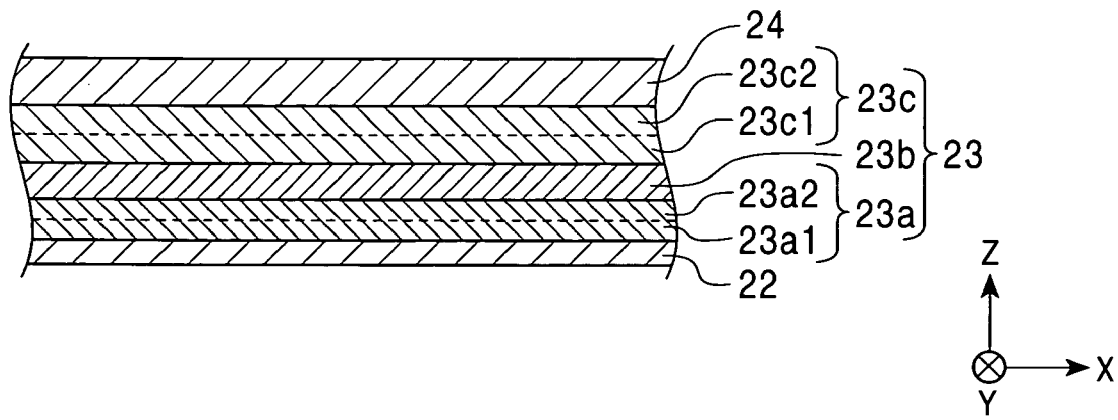
FIG. 8 a partial cross-sectional view of a fixed magnetic layer and its vicinity of a magnetic sensor of the present invention.

FIGS. 6 to 8 are partial cross-sectional views each showing other embodiments of the fixed magnetic layer 23.

As shown in FIG. 6, the first magnetic layer 23a forming the fixed magnetic layer 23 may be formed of an fcc magnetic sublayer 23a1 provided at the non-magnetic metal layer 22 side and a bcc magnetic sublayer 23a2 provided at the non-magnetic interlayer 23b side.

The fcc magnetic sublayer 23a1 has a face-centered cubic (fcc) structure and is a magnetic layer in which equivalent crystal planes represented by the {111} plane are oriented in the direction parallel to the interface, and the bcc magnetic sublayer 23a2 has a body-centered cubic (bcc) structure and is a magnetic layer in which equivalent crystal planes represented by the {110} plane are oriented in the direction parallel to the interface.

The fcc magnetic sublayer 23a1 may be formed using Co or fcc $Co_xFe_y$, and the bcc magnetic sublayer 23a2 may be formed using bcc $Co_xFe_y$.

When the first magnetic layer 23a is formed to have a bcc structure in the vicinity of the interface at the non-magnetic interlayer 23b side, the magnetostriction constant λ can be increased, and hence a large magnetoelastic effect can be obtained. In addition, when the composition at the non-magnetic interlayer 23b side is bcc $Co_xFe_y$, the RKKY interaction between the first magnetic layer 23a and the second magnetic layer 23c with the non-magnetic interlayer 23b interposed therebetween is enhanced.

In addition, when the first magnetic layer 23a is formed to have an fcc structure in the vicinity of the interface at the non-magnetic metal layer 22 side, the crystal orientations of the fixed magnetic layer 23, the non-magnetic material layer, and the free magnetic layer becomes uniform, and the size of the crystal grains can also be increased, thereby increasing the rate (MR rate) of change in magnetoresistance.

In addition, as shown in FIG. 7, the second magnetic layer 23c forming the fixed magnetic layer 23 may be formed of an fcc magnetic sublayer 23c2 provided at the non-magnetic material layer 24 side and a bcc magnetic sublayer 23c1 provided at the non-magnetic interlayer 23b side.

The fcc magnetic sublayer 23c2 has a face-centered cubic (fcc) structure and is a magnetic layer in which equivalent crystal planes represented by the {111} plane are oriented in the direction parallel to the interface, and the bcc magnetic sublayer 23c1 has a body-centered cubic (bcc) structure and is a magnetic layer in which equivalent crystal planes represented by the {110} plane are oriented in the direction parallel to the interface.

As in the above first magnetic layer 23a, the second magnetic layer 23c may be formed such that the fcc magnetic sublayer 23c2 may be formed of Co or fcc $Co_xFe_y$, and the bcc magnetic layer 23c1 may be formed of bcc $Co_xFe_y$.

When the second magnetic layer 23c is formed to have a bcc structure in the vicinity of the interface at the non-magnetic interlayer 23b side, the magnetostriction constant $\lambda$ can be increased, and hence a large magnetoelastic effect can be obtained. In addition, when the composition at the non-magnetic interlayer 23b side is bcc $Co_xFe_y$, the RKKY interaction between the first magnetic layer 23a and the second magnetic layer 23c with the non-magnetic interlayer 23b interposed therebetween is enhanced.

In addition, when the first magnetic layer 23a is formed to have an fcc structure in the vicinity of the interface at the non-magnetic metal layer 22 side, degradation of magnetoresistive effect can be suppressed.

In addition, as shown in FIG. 8, the first magnetic layer 23a forming the fixed magnetic layer 23 may be formed of the fcc magnetic sublayer 23a1 provided at the non-magnetic metal layer 22 side and the bcc magnetic sublayer 23a2 provided at the non-magnetic interlayer 23b side, and the second magnetic layer 23c may be formed of the fcc magnetic sublayer 23c2 provided at the non-magnetic material layer 24 side and the bcc magnetic sublayer 23c1 provided at the non-magnetic interlayer 23b side.

As shown in FIGS. 6 to 8, the first magnetic layer 23a has a structure formed of a fcc magnetic sublayer 23a1 and a bcc magnetic sublayer 23a2 laminated to each other, and in addition, the second magnetic layer 23c has a structure formed of a bcc magnetic sublayer 23c1 and a fcc magnetic sublayer 23c2 laminated to each other.

However, in the present invention, the first magnetic layer 23a of the fixed magnetic layer 23 may have an fcc structure in the vicinity of the interface at the non-magnetic metal layer 22 side and a bcc structure in the vicinity of the interface at the non-magnetic interlayer 23b side. Accordingly, the first magnetic layer 23a may be formed such that in the vicinity of the interface at the non-magnetic metal layer 22 side, the first magnetic layer 23a is Co or fcc $Co_xFe_y$. The Fe content of the first magnetic layer 23a may be gradually increased from the interface at the non-magnetic metal layer 22 side to that at the non-magnetic interlayer 23b side such that in the vicinity of the interface at the non-magnetic interlayer 23b side the first magnetic layer 23a is bcc $Co_xFe_y$.

Similar to the composition of the first magnetic layer 23a, the second magnetic layer 23c may also be formed of a CoFe alloy in which the Fe content is gradually increased from the interface at the non-magnetic material layer 24 side to that at the non-magnetic interlayer 23b side.

Figure 9:
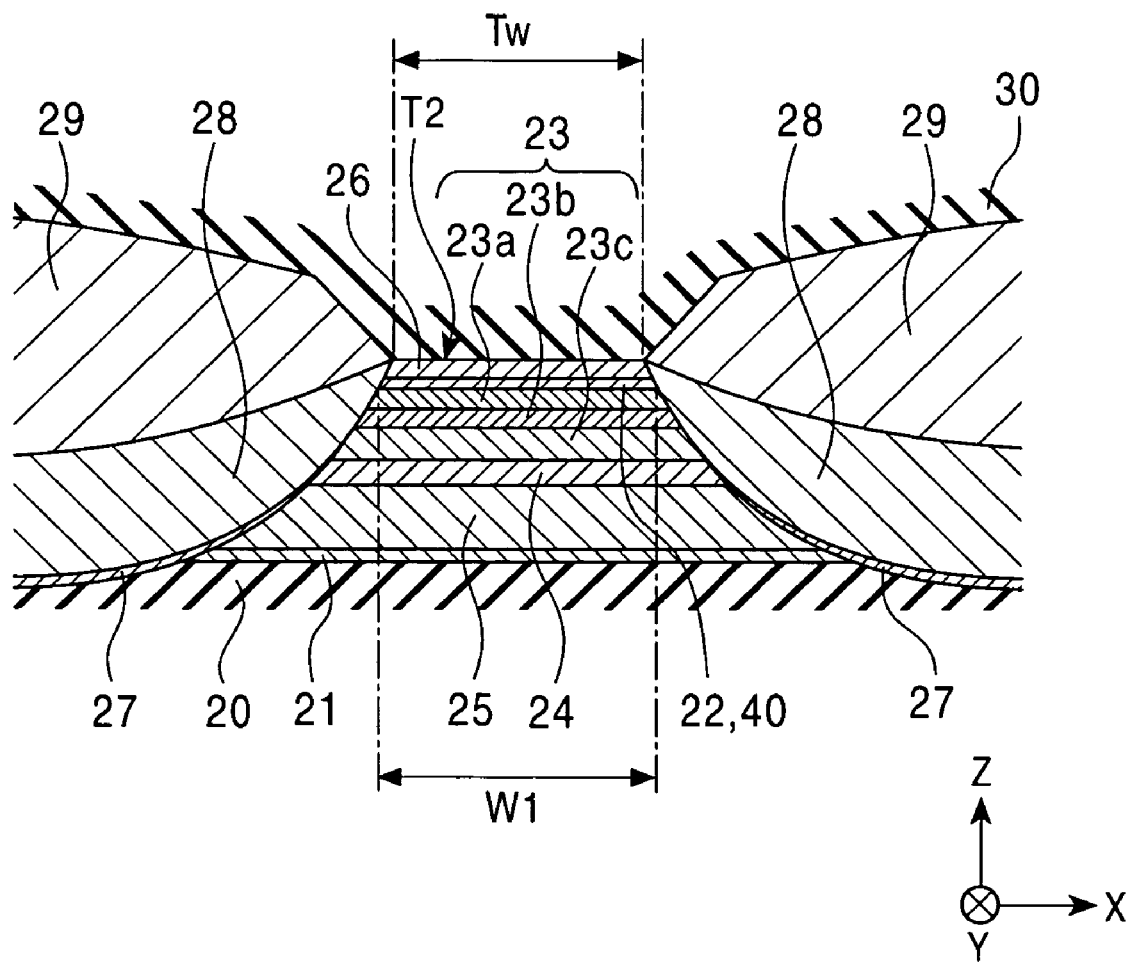
FIG. 9 is a cross-sectional view of the structure of a magnetic sensor according to a second embodiment of the present invention, when it is viewed from a face opposing a recording medium.

FIG. 9 is a cross-sectional view showing a magnetic sensor of a second embodiment according to the present invention, when it is viewed from a face opposing a recording medium.

The magnetic sensor shown in FIG. 9 is similar to the magnetic sensor shown in FIG. 1, and instead of the multilayer film T1, the structure in which a multilayer film T2 is formed is different from that of the magnetic sensor shown in FIG. 1. The multilayer film T2 is formed of the seed layer 21; free magnetic layer 25; the non-magnetic material layer 24; the fixed magnetic layer 23 composed of the second magnetic layer 23c, the non-magnetic interlayer 23b, and the first magnetic layer 23a; the non-magnetic metal layer 22; and the protective layer 26 laminated to each other in that order from the bottom. That is, the multilayer film T2 has the structure in which the constituent layers thereof are laminated to each other in the order opposite to that in the multilayer film T1.

In the magnetic sensor of this embodiment, the first magnetic layer 23a of the fixed magnetic layer 23 is also in contact with the non-magnetic metal layer 22.

In this embodiment, the crystal structure of the non-magnetic metal layer 22 also continuously maintains a face-centered cubic (fcc) structure which is formed during formation of the film.

Accordingly, the atoms forming the non-magnetic metal layer 22 and the atoms forming the first magnetic layer 23a of the fixed magnetic layer 23 are aligned with each other, and hence the crystal of the non-magnetic metal layer 22 and the crystal of the first magnetic layer 23a of the fixed magnetic layer 23 is placed in an epitaxially aligned state.

In addition, the nearest interatomic distance of the first magnetic layer 23a in the {111} plane or in the {110} plane is different from that of the non-magnetic metal layer 22 in the {111} plane by at least the particular value. Hence, in the vicinity of the interface between the first magnetic layer 23a and the non-magnetic metal layer 22, while the atoms forming the first magnetic layer 23a and the atoms forming the non-magnetic metal layer 22 are being aligned with each other, strains are generated in the individual crystal structures. Accordingly, since the strain is generated in the crystal structure of the first magnetic layer 23a, the magnetostriction constant $\lambda$ thereof can be increased.

In order to increase the anisotropy based on the magnetoelastic effect of the fixed magnetic layer 23, compressive stresses are increased which are applied to the multilayer film T1 or T2 in the directions parallel and antiparallel to the track width direction from the bias underlying layers 27, the hard bias layers 28, and the electrode layers 29.

For example, when the electrode layers 29 are composed of a film of Cr (bcc), α-Ta (bcc), or Rh (fcc), and when the spacing of the crystal lattice plane of the electrode layers 29 in the direction parallel to a surface of the film is about 0.2044 nm or more, about 0.2337 nm or more, or about 0.2200 nm or more, respectively, the compressive stresses applied to the multilayer film T1 or T2 can be increased. In this case, in the direction indicated by the arrows shown in FIG. 2, that is, in directions outside the electrode layers 29, the electrode layers 29 are extended, and hence compressive stresses are applied to the multilayer film T1 or T2 in the directions parallel and antiparallel to the track width direction (X direction in the figure).

The spacing of the crystal lattice of the electrode layers 29 in the direction parallel to the film surface can be measured using X-ray diffraction or electron beam diffraction. In addition, the spacing of the crystal lattice of bulk Cr, bulk α-Ta, or bulk Rh in the direction parallel to a film surface thereof is 0.2040 nm, 0.2332 nm, or 0.2196 nm, respectively. When the spacing is not less than that described above, the electrode layers 29 start to apply the compressive stresses to the multilayer film T1 or T2.

When the electrode layers 29 are formed using Cr and a soft metal material such as Au, the compressive stresses described above are as follows. For films formed by a bias underlying layer of Cr (50 Å), a hard bias underlying layer of CoPt (200 Å), an interlayer of Ta (50 Å), an electrode layer, and a protective layer of Ta (50 Å) laminated to each other in that order from the bottom: when the electrode layer is Au (800 Å), a compressive stress of 280 MPa is generated, while when the electrode layer is Cr (1,400 Å), a compressive stress of 670 MPa is generated.

Although not shown in FIG. 1, the interlayer Ta (50 Å) and the protective layer Ta (50 Å) serve as layers for regulating the orientation of the electrode layer and preventing oxidation, respectively.

When the electrode layers 29 are formed by sputtering, ion beam sputtering is used, and the pressure of Ar, Xe, Kr, or the like in a sputtering machine is reduced to $5 \times 10^{-3}$ to $1 \times 10^{-1}$ (Pa). When the pressure of Ar, Xe, Kr, or the like in a sputtering machine is low, the probability in which Cr, Ta, or Rh atoms forming the electrode layer collide with Ar atoms is decreased, and hence atoms such as Cr are deposited while a high energy thereof is maintained. When Cr atoms sputtered from a target or the like collide against a Cr film previously formed with high energy and are then buried therein, the electrode layers 29 are extended outside.

The magnetization directions of the side portions of the fixed magnetic layer 23 in the track width direction are liable to be inclined by a longitudinal bias magnetic field generated by the hard bias layers 28. However, large compressive stresses are applied to the side portions of the fixed magnetic layer 23 in the track width direction. Accordingly, the anisotropy is increased by the magnetoelastic effect at the side portions of the fixed magnetic layer 23 in the track width direction, and as a result, the magnetization directions are tightly fixed in one direction.

According to the present invention, the magnetization direction of the fixed magnetic layer 23 is fixed by the uniaxial anisotropy based on the relationship between the magnetostriction and the compressive stresses from the side portions of the fixed magnetic layer 23. The compressive stresses applied to the fixed magnetic layer 23 at the side portions in an optical track width direction are high, and the compressive stress applied thereto at the central portion is low. Hence, when the width dimension of the fixed magnetic layer 23 in the optical track width direction is large, the force fixing the magnetization direction of the fixed magnetic layer 23 at the central portion is decreased. Accordingly, an optical track width dimension W1 of the fixed magnetic layer 23 is about 0.15 μm or less.

In addition, the magnetostriction of the free magnetic layer 25 has a negative magnetostriction constant. As described above, since the compressive stresses are applied to the multilayer film T1 of the magnetic sensor from side portions thereof, by the magnetoelastic effect, the free magnetic layer 25 having a negative magnetostriction constant has an easy magnetization axis which is parallel or antiparallel to the track width direction.

The magnetizations of the free magnetic layer 25 at the side portions in the track width direction may be unstablized due to demagnetizing fields. However, the side portions of the free magnetic layer 25 in the track width direction are close to the hard bias layers 28, and hence large compressive stresses are applied to the side portions of the free magnetic layer 25. Accordingly, at the side portions of the free magnetic layer 25 in the track width direction, the anisotropy by the magnetoelastic effect is increased, and as a result, the magnetization direction is stabilized.

Hence, even when the thicknesses of the hard bias layers 28 are decreased so as to decrease the longitudinal bias magnetic field, the free magnetic layer 25 may be placed in a stable single domain state. When the longitudinal bias magnetic field can be decreased by decreasing the thicknesses of the hard bias layers 28, the magnetization state of the fixed magnetic layer 23 fixed in the height direction can be stabilized.

In addition, since the compressive stress in the vicinity of the central portion of the free magnetic layer 25 is low compared to that at each of the side portions thereof, the decrease in magnetic field detection sensitivity can be suppressed.

The magnetostriction constant λ of the free magnetic layer 25 is in the range of from $-8 \times 10^{-6}$ to $-0.5 \times 10^{-6}$. In addition, the thickness t of the hard bias layers 28 is in the range of from about 100 to about 200 Å. When the magnetostriction constant λ of the free magnetic layer 25 is too small, or the thickness of the hard bias layers 28 is too large, reproduction sensitivity of the magnetic sensor is degraded. On the other hand, when the magnetostriction constant λ of the free magnetic layer 25 is too large, or the thickness t of the hard bias layers 28 is too small, reproduction waveform of the magnetic sensor is liable to be distorted.

The magnetic sensors of the embodiments shown in FIGS. 1 and 9 are manufactured by thin-film formation using a sputtering or a deposition method and pattern formation using resist photolithography. Generally known sputtering and resist photolithography may be used for forming the magnetic sensors of the embodiments.

However, in order to generate stresses in the individual crystal structures while the atoms forming the first magnetic layer 23a and the atoms forming the non-magnetic metal layer 22 are being aligned with each other, when the non-magnetic metal layer 22 and the first magnetic layer 23a are formed, for example, the following conditions are used:

DC Magnetron Sputtering Method
  Input Power to Target: 10 to 100 W
  Ar pressure: 0.01 to 0.5 Pa
  Distance between Target and Substrate: 100 to 300 mm In addition, in forming the magnetic sensor shown in FIG. 1, when the substrate temperature used during formation of the first magnetic layer 23a is set higher than that used during formation of the non-magnetic metal layer 22, due to thermal expansion, a larger strain can be generated in alignment. When the magnetic sensor shown in FIG. 9 is formed, the substrate temperature used during formation of the non-magnetic metal layer 22 is higher than that used during formation of the first magnetic layer 23a.

After the magnetic sensor shown in FIG. 1, which is provided with the hard bias layers 28 at the side portions of the multilayer film T1, is formed, for example, a high magnetic field of 1,200 (KA/m) is applied in the height direction, so that the magnetizations of the first magnetic layer 23a, the second magnetic layer 23c, and the hard bias layers 28 are oriented in the height direction. Subsequently, the applied magnetic field is continuously decreased so as to be smaller than a spin flop magnetic field for the first magnetic layer 23a and the second magnetic layer 23c. As a result, the magnetizations of the first magnetic layer 23a and the second magnetic layer 23c are oriented antiparallel to each other. After the magnetic field applied in the height direction is removed, a magnetic field larger than the coercive force of the hard bias layers 28 is applied in the track width direction, thereby magnetizing the hard bias layers 28.

When the magnetic field applied in the track width direction is removed, the magnetizations of the first magnetic layer 23a and the second magnetic layer 23c of the fixed magnetic layer 23 are oriented antiparallel or parallel to each other in the height direction, primarily due to the magnetoelastic effect. In addition, the free magnetic layer 25 is placed in a single domain state in the track width direction due to the longitudinal bias magnetic field from the hard bias layers 28.

In addition, by applying a magnetic field in the height direction when the fixed magnetic layer 23 is formed, the induced anisotropy may be imparted to the first magnetic layer 23a and the second magnetic layer 23c of the fixed magnetic layer 23.

However, when the optical track width dimension of the fixed magnetic layer 23 is 0.15 μm or less, the influence of the magnetoelastic effect is significantly increased. In particular, in the present invention, since the magnetostriction constants λ of the first magnetic layer 23a and the second magnetic layer 23c and the compressive stresses applied to the multilayer film T1 in the track width direction are increased, the magnetization of the fixed magnetic layer 23 is fixed primarily by the magnetoelastic effect.

In this embodiment, laminates that are each composed of the hard bias layer 28 and the electrode layer 29 are formed on the side portions of each of the multilayer films T1 and T2. The laminates described above cause compressive stresses to be applied to the multilayer films T1 and T2. However, the hard bias layers 28 do not have to be provided at the side portions of each of the multilayer films T1 and T2. For example, on the side portions of each of the multilayer films T1 and T2, laminates that are each composed of a soft magnetic material layer and an antiferromagnetic layer may be provided, or only insulating layers may be provided.

In addition, the present invention may be applied to a tunnel magnetoresistive element and a CPP-GMR sensor, in which a sense current flows in the direction perpendicular to the film thickness of each of the multilayer film T1 and T2. In this case, the electrode layers are formed at an upper side and a lower side of each of the multilayer film T1 and T2.

Next, a magnetic sensor of a third embodiment according to the present invention will be described. Unlike the magnetic sensors described with reference to FIGS. 1 and 9, in the magnetic sensor of this embodiment, the non-magnetic metal layer 22 is formed using an antiferromagnetic layer 40.

However, by the antiferromagnetic layer 40, the uniaxial exchange coupling magnetic field (Hex) is not generated with the first magnetic layer 23a, or even when generated, the uniaxial exchange coupling magnetic field (Hex) is extremely weak, and hence the magnetization of the first magnetic layer 23a cannot be fixed in the height direction by the exchange coupling magnetic field.

The antiferromagnetic layer 40 generates an antiferromagnetic exchange coupling with the first magnetic layer 23a. However, since the antiferromagnetic layer 40 has a very small thickness, such as 5 to 50 Å, preferably 5 to 18 Å, or more preferably 14 to 18 Å, KAF (crystal magnetic anisotropy)·t of the antiferromagnetic layer 40 is smaller than j·k (interface exchange coupling energy at the interface between an antiferromagnetic layer and a ferromagnetic body)(units of KAF·t and j·k are both $J/m^2$), it has been believed that although the antiferromagnetic spin rotates together with the ferromagnetic spin, anisotropic dispersion corresponding to the above KAF may occur in the first magnetic layer 23a.

Since the anisotropic dispersion is generated in the first magnetic layer 23a due to the influence of the antiferromagnetic layer 40 as described above, the uniaxial exchange coupling magnetic field is not generated with the first magnetic layer 23a, or even when generated, the uniaxial exchange coupling magnetic field is extremely weak; however, due to the anisotropic dispersion, a coercive force Hc of the first magnetic layer 23a is increased.

When the antiferromagnetic layer 40 is formed to have a thickness of 5 to 18 Å, the coercive force Hc of the fixed magnetic layer 23 can be increased, and in addition, the rate of baseline-noise generation can be appropriately decreased. In addition, the rate of PLR (Pinned Layer Reversal) generation can also be decreased.

When the antiferromagnetic layer 40 is formed to have a thickness of 14 to 18 Å, the coercive force Hc of the fixed magnetic layer 23 can be more reliably increased, and in addition, the rate of PLR (Pinned Layer Reversal) generation can be more effectively decreased.

The thickness of the antiferromagnetic layer 40 is most preferably in the range of from 16 to 18 Å. Accordingly, the coercive force Hc of the fixed magnetic layer 23 can be reliably set to an extremely high value (in particular, 600 Oe=approximately $4.74 \times 10^4$ A/m), and the rate of PLR (Pinned Layer Reversal) generation can be decreased to approximately zero.

According to the present invention, as a material for the antiferromagnetic layer 40, an X—Mn alloy (where X is at least one element selected from the group consisting of Pt, Pd, Ir, Rh, Ru, Os, Ni, and Fe) may be mentioned by way of example.

However, among the alloys mentioned above, in order to appropriately generate the anisotropic dispersion in the first magnetic layer 23a by an antiferromagnetic layer having a small thickness as described above, an irregular phase antiferromagnetic layer is preferably used, and for example, an IrMn alloy, an RuMn alloy, or an RhMn alloy may be used.

As described above, the content of the X element of the X—Mn alloy is preferably in the range of from 45 to 99 atomic percent; however, when the X—Mn alloy is used as the antiferromagnetic layer 40, the content of the X element of the X—Mn alloy is preferably in the range of from 15 to 29 atomic percent. Accordingly, even when the film thickness is decreased as described above, an antiferromagnetic layer which appropriately generates the anisotropic dispersion can be formed.

Also in the case in which the antiferromagnetic layer 40 is used instead of the non-magnetic metal layer 22, as described above with reference to FIG. 3, while atoms forming the antiferromagnetic layer 40 and atoms forming the first magnetic layer 23a are being aligned with each other, strains are generated in the individual crystal structures in the vicinity of the interface therebetween.

As described above, even when the antiferromagnetic layer 40 is used, since the strain is generated in the crystal structure of the first magnetic layer 23a, the magnetostriction constant λ thereof can be increased, and hence a significant magnetoelastic effect can be obtained.

When the antiferromagnetic layer 40 is used instead of the non-magnetic metal layer 22, in addition to the increase in magnetostriction constant λ, the coercive force of the first magnetic layer 23a can also be increased.

Since the anisotropic dispersion of the first magnetic layer 23a can be increased by the influence of the interaction with the antiferromagnetic layer 40, the coercive force Hc of the fixed magnetic layer 23 can be increased. Hence, even when the magnetic sensor impinges upon protrusions or the like on a media while traveling thereabove, or even when a semi-finished magnetic sensor receives a mechanical stress generated in a manufacturing process, the magnetization of the fixed magnetic layer 23 aligned in the height direction is not reversed. Even when the reversal occurs, the degree of the magnetization reversal is not significant, so that the magnetization will not become parallel to the track width direction (X direction in the figure). Hence, when the stress described above is removed, the magnetization state can be smoothly recovered to the original state. As a result, the reproduction properties can be made stable even when the mechanical stress is generated, and hence the reliability of the magnetic sensor can be improved.

In addition, the crystal orientation and the like of the antiferromagnetic layer 40 are the same as those of the non-magnetic metal layer 22 as described above with reference to FIGS. 1 and 9, and the rest of the structure is also the same as that described with reference to FIGS. 1 and 9.

The preferred embodiments of the present invention have been described; however, various modifications may be performed without departing from the spirit and the scope of the present invention.

In addition, the above embodiments are described by way of example, and it is to be understood that the present invention is not limited thereto.

EXAMPLES

The change in magnetostriction of CoFe was measured when the composition ratio of a PtMn layer of the laminate was changed, the laminate made of the PtMn layer and a CoFe layer provided thereon.

A multilayer film having the following structure was formed and was then annealed at 290° C. for four hours.

The multilayer film had the structure composed of alumina (1,000 Å), $(Ni_{0.8}Fe_{0.2})_{60}Cr_{40}$ (52 Å), $Pt_xMn_{100-x}$ (30 Å), $Co_{90}Fe_{10}$ (20 Å), and Ru (9 Å) provided in that order on a silicon substrate.

In this example, by omitting the second magnetic layer, the non-magnetic material layer, the free magnetic layer, and the like, measurement of the magnetostriction of the first magnetic layer 23a was accurately performed.

For the measurement of the magnetostriction, an optical lever method was used. While the surface of the multilayer film described above was irradiated with laser beams, a magnetic field was applied to the multilayer film in the direction parallel to the film surface thereof. The deflection of the multilayer film caused by the magnetostriction was read as the change in reflection angle of the laser beams, and the magnetostriction constant of the multilayer film was obtained thereby.

Figure 10:
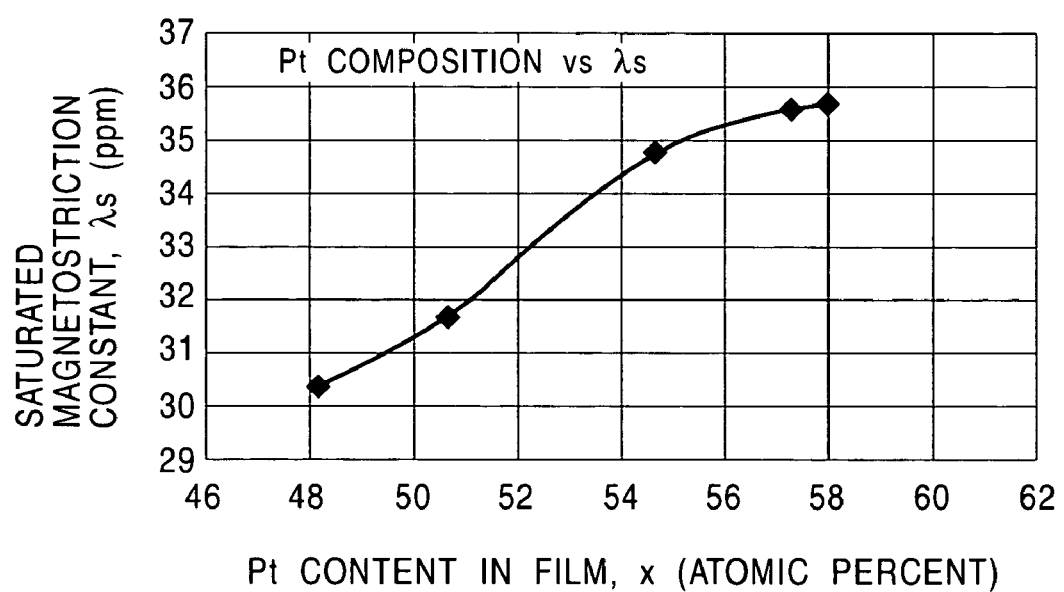
FIG. 10 is a graph showing the relationship between the magnetostriction of a CoFe layer and the composition of a PtMn layer obtained when the CoFe layer is provided on the PtMn layer.

The results are shown in FIG. 10. As shown in FIG. 10, as the Pt content of the PtMn layer was increased, the magnetostriction constant of the multilayer film was increased. In particular, as the Pt content increased from 51 atomic percent to 55 atomic percent, the magnetostriction constant rapidly increased. As the Pt content increased from 55 atomic percent, while the magnetostriction constant still increased, the rate of increase was lower.

The reason for these increases in the magnetostriction constant is believed to be that as the Pt content of the PtMn layer is increased, the crystal lattice constant of the PtMn is increased. As a result, a strain in the vicinity of the interface between the PtMn layer and the CoFe layer is increased.

Next, when a CoFe layer was provided on a PtMn layer, and a Co layer was provided on a PtMn layer, the magnetostriction constants of CoFe and Co were compared to each other.

A multilayer film was formed with a structure composed of: alumina (1,000 Å), $(Ni_{0.8}Fe_{0.2})_{60}Cr_{40}$ (52 Å), $Pt_{50}Mn_{50}$ (0 Å or 30 A), PIN 1 (X Å), Ru (9 Å), Cu (85 Å), and Ta (30 Å) provided in that order on a silicon substrate (where the PIN 1 layer was $Co_{90}Fe_{10}$ or Co). The multilayer film was then annealed at 290° C. for 4 hours.

An optical lever method was used for measuring the magnetostriction.

Figure 11:
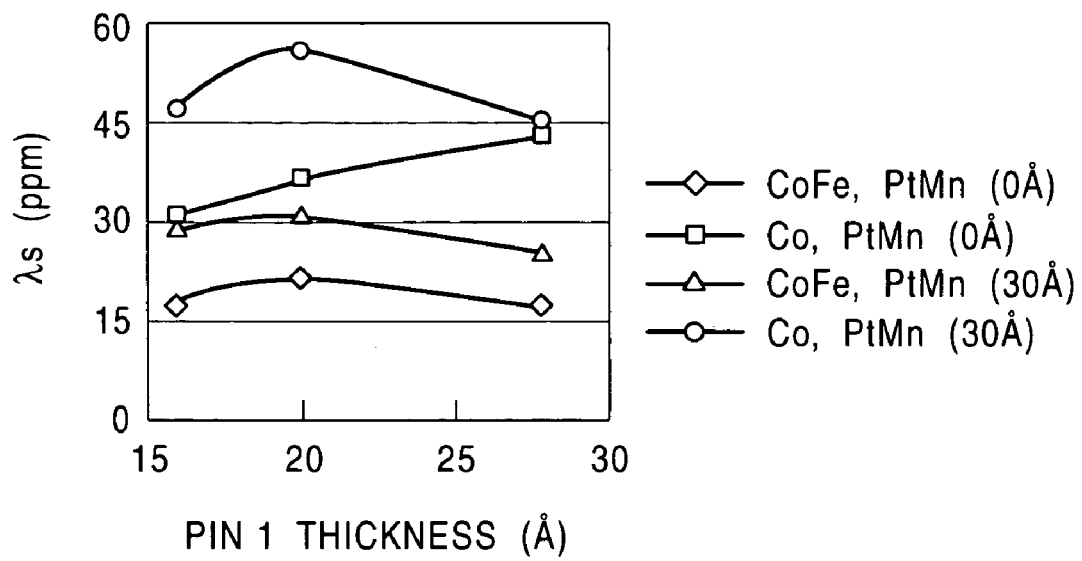
FIG. 11 is a graph showing the magnetostriction constants of Co and CoFe obtained when a CoFe layer is provided on a PtMn layer and when a Co layer is provided on a PtMn layer.

The results are shown in FIG. 11. In both cases in which Co and CoFe were used for forming the PIN 1 layer, when the PtMn layer was provided, the magnetostriction constant was large compared to the magnetostriction constant in structures in which the PtMn layer was not provided. In addition, when the PIN 1 layer was made of Co, the magnetostriction constant was larger than the magnetostriction constant obtained when CoFe was used.

As illustrated, when the PIN 1 layer was made of Co and the PtMn layer (30 Å) was provided under the PIN 1 layer, the magnetostriction constant increased as the thickness of the PIN 1 layer increased from 16 to 20 Å. However, when the thickness thereof was more than 20 Å, the magnetostriction constant decreased.

The results indicate that when the thickness of the PIN 1 layer is excessively large, the magnetostriction constant decreases. This decreases the benefits obtained by the strain generated in the vicinity of the interface between the PIN 1 layer and the PtMn layer.

Next, a PtMn layer was provided on the PIN 1, and the magnetostriction constants of Co and CoFe were compared to each other.

A multilayer film was formed with a structure composed of: alumina (1,000 Å), $(Ni_{0.8}Fe_{0.2})_{60}Cr_{40}$ (52 Å), Cu (85 Å), Ru (9 Å), PIN 1 layer (X Å), $Pt_{50}Mn_{50}$ (0 Å or 30 Å), and Ta (30 Å) provided in that order on a silicon substrate (where the PIN 1 was $Co_{90}Fe_{10}$ or Co). The multilayer film was then annealed at 290° C. for 4 hours.

As above, an optical lever method was used for measuring the magnetostriction.

Figure 12:
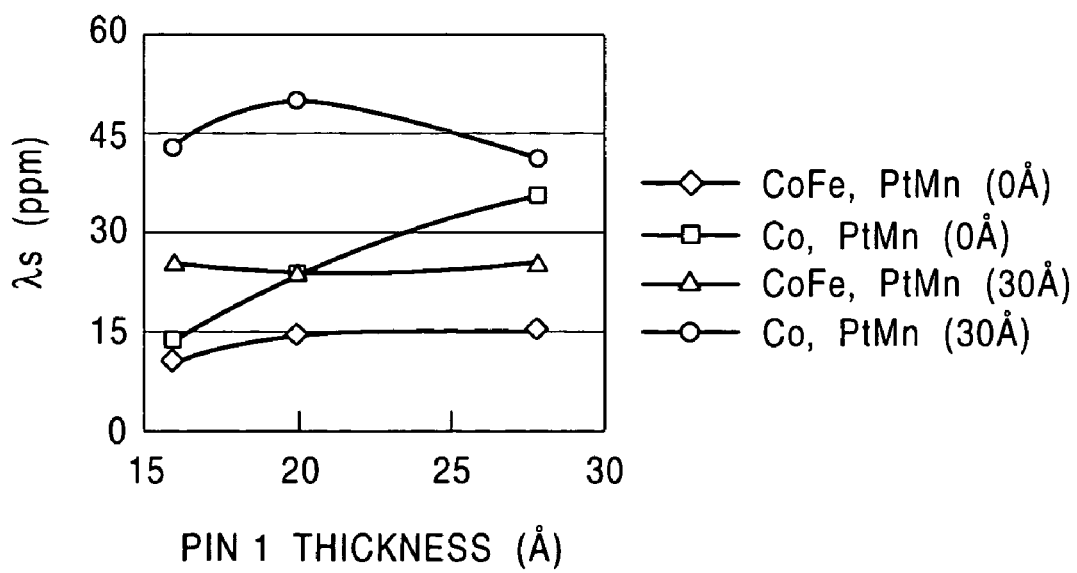
FIG. 12 is a graph showing the magnetostriction constants of Co and CoFe obtained when a PtMn layer is provided on a CoFe layer and when a PtMn layer is provided on a Co layer.

The results are shown in FIG. 12. When the PtMn layer was formed on the PIN 1 layer, the same tendency was obtained as that obtained when the PtMn layer was formed under the PIN 1 layer.

That is, in both cases in which Co and CoFe were used for forming the PIN 1 layer, when the PtMn layer was provided, the magnetostriction constant was larger than that obtained when the PtMn layer was not provided. In addition, when the PIN 1 layer was made of Co, the magnetostriction constant was larger than that obtained when CoFe was used. Furthermore, when the PIN 1 layer was made of Co and the PtMn layer (30 Å) was provided on the PIN 1 layer, the magnetostriction constant increased as the thickness of the PIN 1 layer increased from 16 to 20 Å. However, when the thickness of the PIN 1 layer was more than 20 Å, the magnetostriction constant decreased.

Next, a PtMn layer and a multilayer film having a synthetic ferrimagnetic structure were laminated to each other, and the magnetostriction was measured. The multilayer film had a structure composed of: alumina (1,000 Å), $(Ni_{0.8}Fe_{0.2})_{60}Cr_{40}$ (52 Å), $Pt_{50}Mn_{50}$ (30 Å), PIN 1 (16 Å), Ru (9 Å), PIN 2 layer (40 Å), Cu (85 Å), and Ta (30 Å) provided in that order on a silicon substrate (where the PIN 1 layer and the PIN 2 layer were $Co_{90}Fe_{10}$, $Fe_{50}Co_{50}$, or Co) The multilayer film was then annealed at 290° C. for 4 hours.

In this embodiment, the thickness of the PIN 2 layer was larger than the above thickness so that a spin flop magnetic field between the PIN 1 and the PIN 2 layers was increased, and hence the magnetostriction was easily measured.

A bending method was used for measuring the magnetostriction. The bending method is a method in which a uniaxial strain is applied to the multilayer film by bending thereof. The magnetostriction constant is measured from the change in uniaxial anisotropy caused by a reverse magnetostriction effect.

The results are shown in Table 1.

TABLE 1

| PIN 1 | $Co_{90}Fe_{10}$ | Co | $Fe_{50}Co_{50}$ |
|---|---|---|---|
| PIN 2 | $Co_{90}Fe_{10}$ | Co | $Co_{90}Fe_{10}$ |
| $\lambda_s$ (ppm) | +13.6 | +54.4 | +29.5 |

From these results, it can be seen that when the PIN 1 layer and the PIN 2 layer are formed of Co, the magnetostriction constant is large compared to that obtained when CoFe is used.

Next, the thickness of the non-magnetic metal layer was changed, and the changes in magnetostriction constant of CoFe and Co were compared to each other.

A multilayer film with a structure composed of: alumina (1,000 Å), $(Ni_{0.8}Fe_{0.2})_{60}Cr_{40}$ (52 Å), non-magnetic metal layer, PIN 1 layer, Ru (9 Å), PIN 2 layer (40 Å), Cu (85 Å), and Ta (30 Å) provided in that order on a silicon substrate. The multilayer film was annealed at 290° C. for 4 hours, and then the magnetostriction was measured.

In this embodiment, by omitting the free magnetic layer and the like, the measurement of the magnetostriction of the fixed magnetic layer 23 was accurately performed.

In this example, the non-magnetic metal layer was Ru or $Pt_{50}Mn_{50}$ (atomic percent); the PIN 1 layer was Co, $Co_{90}Fe_{10}$ (atomic percent), or $Fe_{50}Co_{50}$ (atomic percent); and the PIN 2 layer was Co or $Co_{90}Fe_{10}$ (atomic percent). Hereinafter, $Co_{90}Fe_{10}$ (atomic percent) and $Fe_{50}Co_{50}$ (atomic percent) will be simply referred to as "CoFe" and "FeCo", respectively.

For the measurement of the magnetostriction, the bending method described above was used. The results shown in FIG. 13 indicate that, regardless of whether the non-magnetic metal layer was formed of Ru or $Pt_{50}Mn_{50}$ (atomic percent) when the PIN 1 layer was formed Co or FeCo, the magnetostriction constant was larger than that obtained when the PIN 1 layer was formed from CoFe. The reason for this may be that CoFe, unlike Co or FeCo, is a material in which the magnetostriction does not appreciably change, even when a strain is generated.

It can be seen that when the non-magnetic metal layer was formed, the magnetostriction was larger than that obtained when the non-magnetic metal layer was not formed. Also, when the PIN 1 layer was formed from Co, the increase in magnetostriction of the non-magnetic metal layer formed from Ru is equivalent to that of the non-magnetic metal layer formed from $Pt_{50}Mn_{50}$ (atomic percent). When the PIN 1 layer was formed from FeCo, the magnetostriction was larger when the non-magnetic metal layer was formed from $Pt_{50}Mn_{50}$ (atomic percent) than the magnetostriction obtained when the non-magnetic metal layer was formed from Ru.

In addition, when the PIN 1 layer was formed from Co or FeCo, and the thickness of the non-magnetic metal layer was approximately 5 Å or more, the magnetostriction constant gradually decreased as the thickness increased. The reason for may be that the interface between the non-magnetic metal layer and the PIN 1 layer is liable to be in a non-aligned state as the thickness of the non-magnetic metal layer is increased. In other words, when the thickness of the non-magnetic metal layer is decreased, the lattice constant of the non-magnetic metal layer is changed. As a result, the interface between the non-magnetic metal layer and the PIN 1 layer is correspondingly in an aligned state while a strain is generated.

Figure 13:
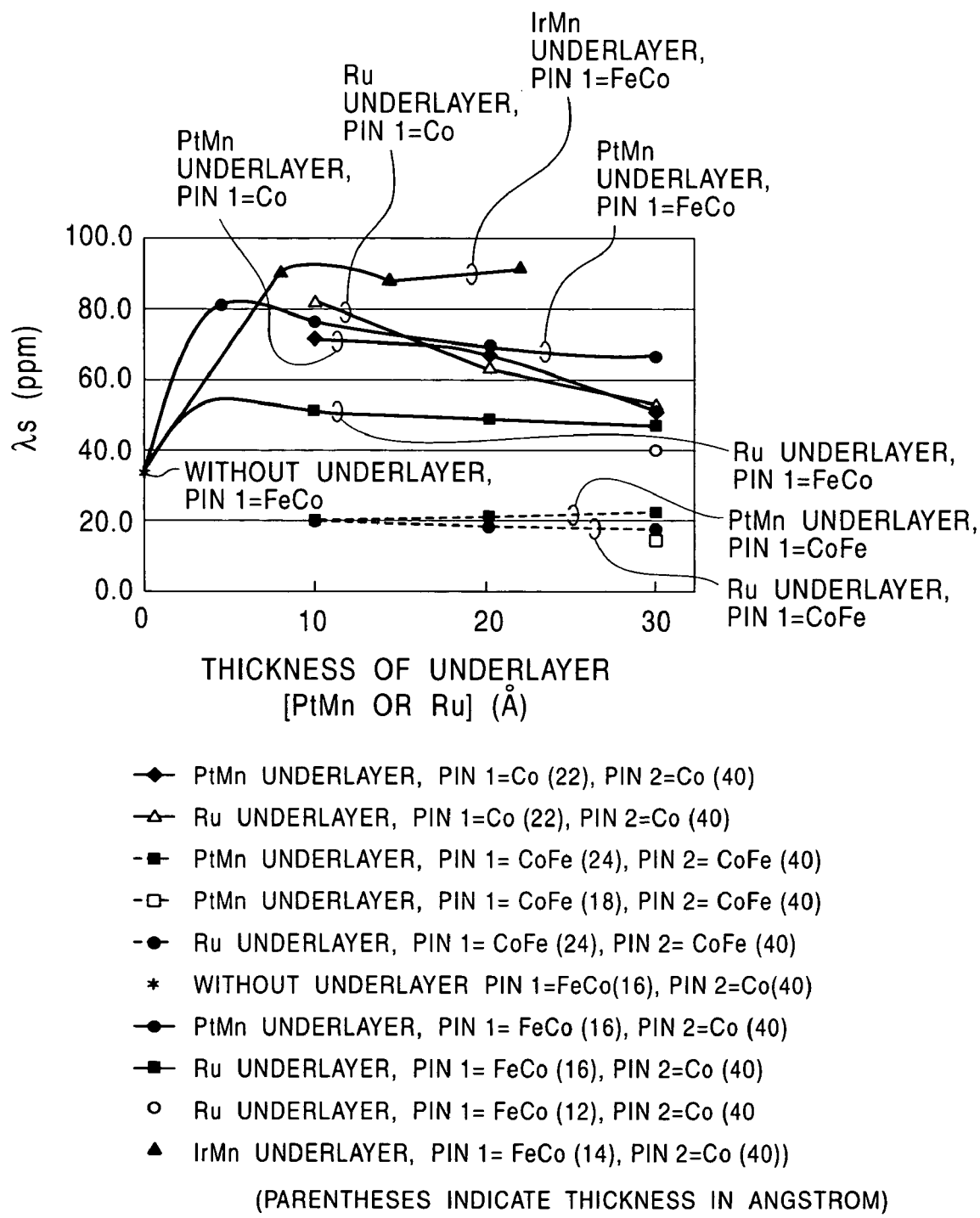
FIG. 13 is a graph showing the magnetostriction of a multilayer film formed of a ferromagnetic layer and a non-magnetic metal layer (PtMn, Ru) or an antiferromagnetic layer (IrMn) laminated thereto.

In FIG. 13, another experimental result is also shown. The multilayer film was formed using the same film structure as described above except that $Ir_{27}Mn_{73}$ (subscript number indicates atomic percent) was used as the non-magnetic metal layer. In addition, $Fe_{60}Co_{40}$ (subscript number indicates atomic percent) was used for the PIN 1, and Co was used for the PIN 2.

As shown in FIG. 13, the magnetostriction constant λs of the multilayer film using IrMn is much higher than that of other multilayer films having different structures, and in addition, it was also found that even when the thickness of IrMn is increased to approximately 30 Å, a stable magnetostriction constant can be obtained.

It is believed that, unlike PtMn and Ru used as the non-magnetic metal layer shown in FIG. 13, the IrMn serves as an antiferromagnetic layer. The reason for this will be described together with the following experimental result of the coercive force.

Figure 14A:
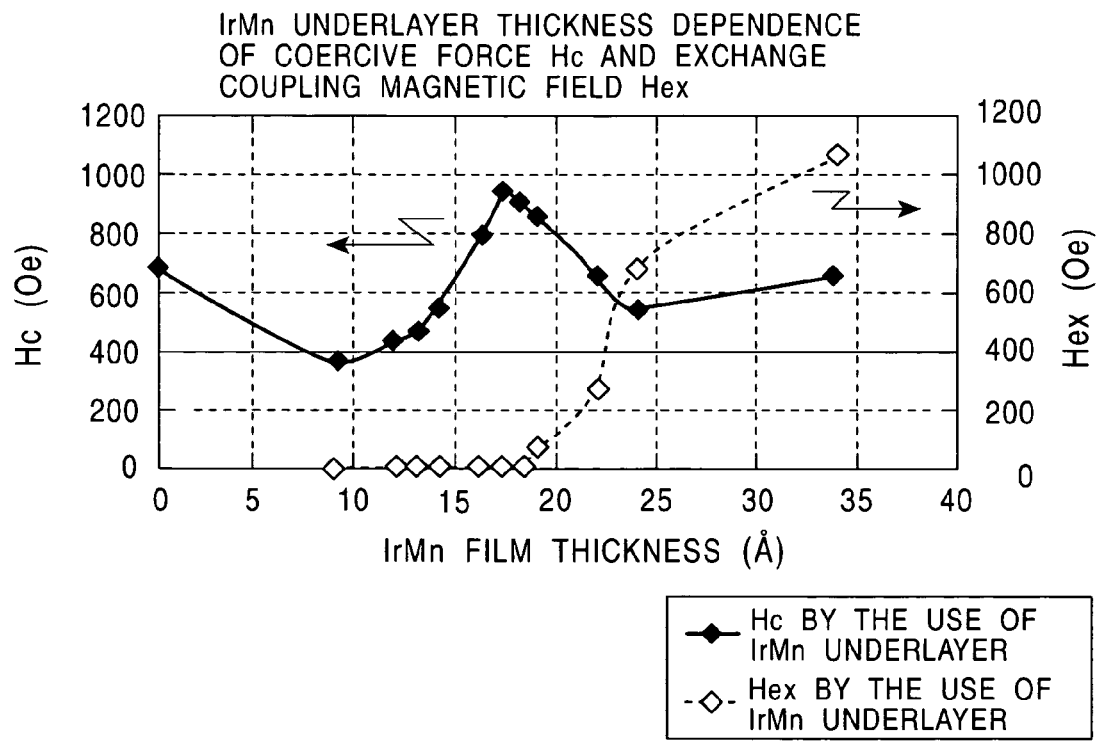
FIG. 14A is a graph showing a coercive force and a uniaxial exchange coupling magnetic field (Hex) of a multilayer film formed of IrMn and a ferromagnetic layer laminated thereto.
Figure 14B:
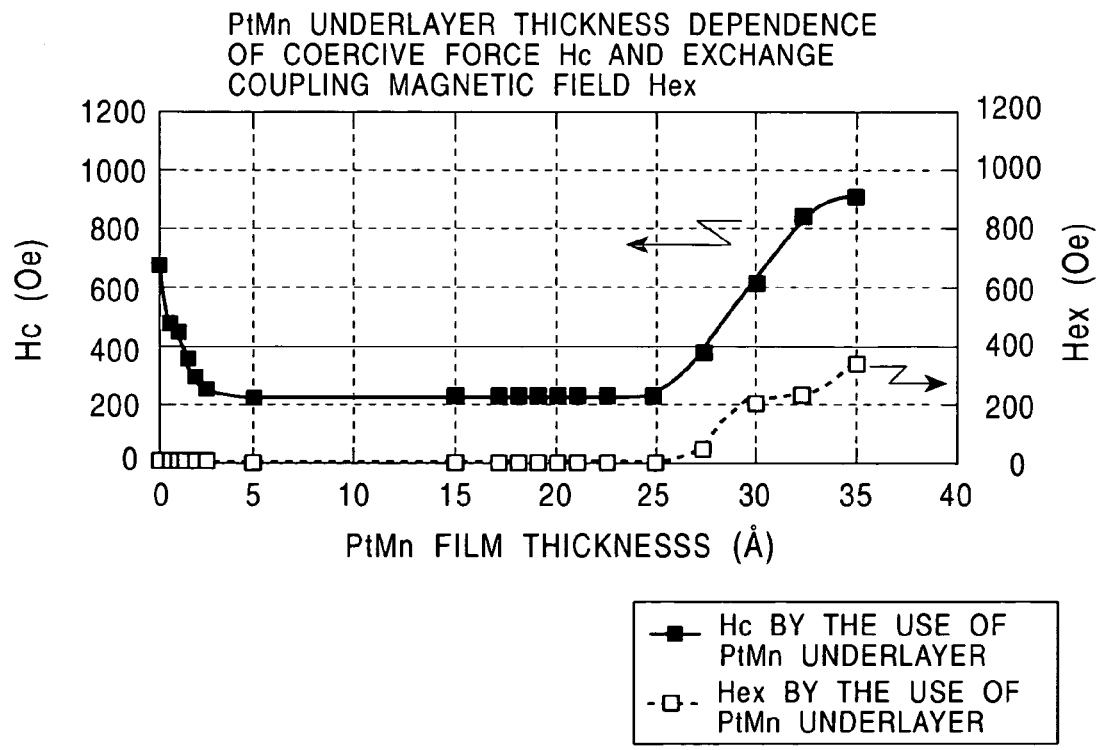
FIG. 14B is a graph showing a coercive force and a uniaxial exchange coupling magnetic field (Hex) of a multilayer film formed of PtMn and a ferromagnetic layer laminated thereto.

FIGS. 14A and 14B show the experimental results of the relationship among the uniaxial exchange coupling magnetic field (Hex), the coercive force, and the film thickness of $Ir_{27}Mn_{73}$ and $Pt_{50}Mn_{50}$, which were obtained using a multilayer film made of a silicon substrate/alumina (1,000 Å)/$(Ni_{0.8}Fe_{0.2})_{60}Cr_{40}$ (52 Å)/$Ir_{27}Mn_{73}$ or $Pt_{50}Mn_{50}$/FeCo/Ru (9 Å)/Cu (85 Å)/Ta (30 Å).

After the multilayer films described above were formed, annealing at 290° C. for four hours was performed.

As shown in FIG. 14A, when the IrMn alloy was used, it was found that the coercive force of the IrMn alloy is rapidly increased when the thickness thereof is set to 12 Å or more and that the coercive force preferably reaches not less than 600 Oe (approximately $4.74 \times 10^4$ A/m) or more or more preferably reaches not less than 800 Oe (approximately $6.32 \times 10^4$ A/m) when the thickness of the IrMn is set to 14 Å or more or is set to 16 Å or more, respectively.

In addition, when the thickness of the IrMn was increased to 18 Å or more as shown in FIG. 14A, it was found that the uniaxial exchange coupling magnetic field (Hex) is generated.

In addition, as shown in FIG. 14B, when the PtMn alloy was used, it was found that the uniaxial exchange coupling magnetic field (Hex) is generated when the thickness of the PtMn alloy is set to 55 Å or more.

The uniaxial exchange coupling magnetic field described above is thermally unstable when the antiferromagnetic layer has not enough film thickness. However, since the thickness thereof is adjusted in the present invention so as not to generate the uniaxial exchange coupling magnetic field, it was found that the film thicknesses of the IrMn alloy and the PtMn alloy are preferably decreased to less than 18 Å and to less than 55 Å, respectively.

In addition, as shown in FIGS. 14A and 14B, when the film thicknesses of IrMn and PtMn were zero (that is, the underlayer was not provided), the coercive force Hc was increased to a certain extent; however, when the underlayer was not provided, the magnetostriction constant λ was extremely decreased as shown in FIG. 13. A sufficient magnetostriction constant λ cannot be obtained when the underlayer has not a thickness of at least 5 Å. Hence, in the present invention, the thickness of the underlayer must be set to 5 Å or more and must also be adjusted so that the uniaxial exchange coupling magnetic field is not generated and so that the shunt loss is sufficiently decreased.

Figure 15:
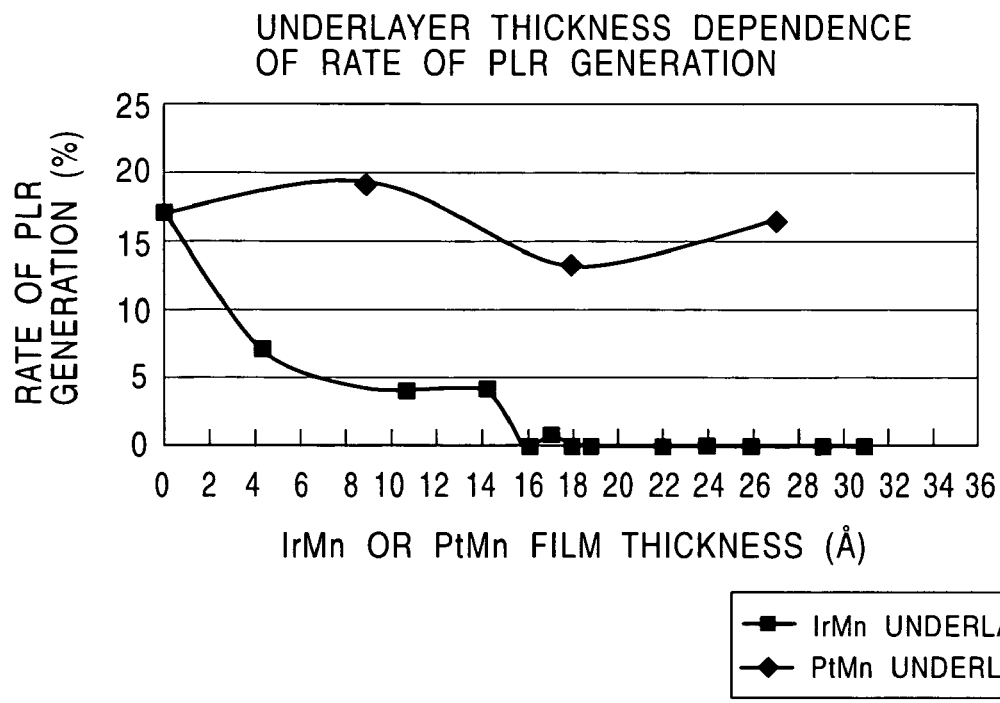
FIG. 15 is a graph showing the rate of PLR generation of a multilayer film formed of a ferromagnetic layer and PtMn or IrMn laminated thereto.

FIG. 15 is a graph showing the relationship between the rate (%) of PLR (Pinned Layer Reversal) generation and the thickness of IrMn or PtMn of the multilayer film used in the experiments shown in FIGS. 14A and 14B, the relationship being obtained using a ultrasonic mechanical stress application device. In the experiment, after a magnetic head provided with the multilayer film described above was processed by ultra-sonic cleaning so that a mechanical stress is intentionally applied thereto, the rate of PLR generation was measured.

As shown in FIG. 15, it was found that when the thickness of IrMn used as the underlayer of the PIN 1 was set to approximately 5 Å or more, 14 Å or more, or 16 Å or more, the rate of PLR generation can be suppressed to approximately 5%, 5% or less, or approximately 0%, respectively.

When the graphs shown in FIGS. 15 and FIGS. 14A and 14B are compared to each other, it was found that an approximately symmetrical relationship is present. That is, as shown by the graphs in FIGS. 14A and 14B, it was found that as the coercive force Hc is increased, the rate of PLR generation is decreased.

As described above, the coercive force and the rate of PLR generation has a close relationship therebetween. When PtMn was used as the underlayer of the PIN 1, a magnetic sensor was only manufactured which had a high rate of PLR generation and which had weak resistance against a mechanical stress. However, it was found that when IrMn is used as the underlayer of the PIN 1, a more reliable magnetic sensor can be manufactured in which the magnetization reversal of the fixed magnetic layer can be suppressed even when a mechanical stress is generated.

Figure 16:
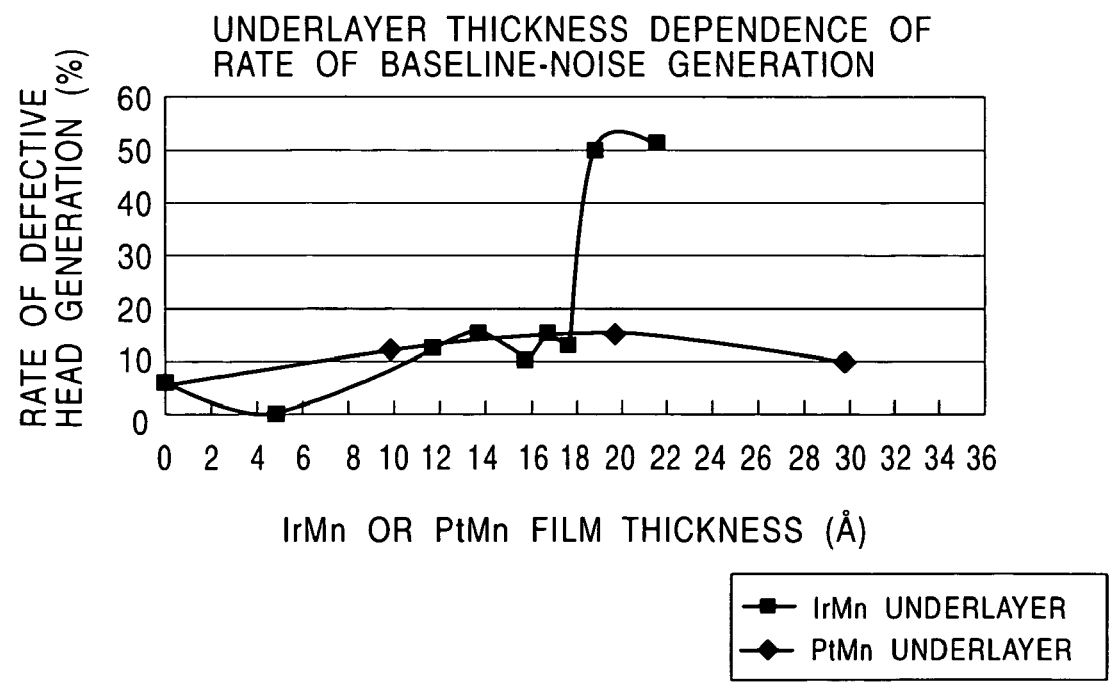
FIG. 16 is a graph showing the rate of baseline-noise generation of a multilayer film formed of a ferromagnetic layer and PtMn or IrMn laminated thereto.

FIG. 16 is a graph showing the relationship between the rate (%) of the baseline-noise generation and the thickness of IrMn or PtMn of the multilayer film used in the experiments shown in FIGS. 14A and 14B.

In this experiment, the rate of defective head generation was measured in which when a baseline noise of a magnetic head along a baseline of the reproduction output exceeded a predetermined threshold value, the magnetic head was regarded as defective.

As shown in FIG. 16, it was found that when the film thickness of IrMn used as the underlayer of the PIN 1 is 18 Å or more, the baseline-noise is rapidly increased.

From the experimental results shown in FIGS. 13 to 16, the following can be understood. The non-magnetic metal layer or the antiferromagnetic layer, which is formed in contact with the PIN 1, is preferably formed to have a thickness of 5 Å or more. By the thickness described above, the magnetostriction constant λs can be appropriately increased (see FIG. 13). In addition, in the case of the antiferromagnetic layer, besides the contribution to the increase in coercive force, the rate of PLR generation can be decreased (see FIGS. 14A, 14B, and 15). Furthermore, when the thickness of the non-magnetic metal layer or the antiferromagnetic layer becomes 50 Å or more, the shunt loss is disadvantageously increased, resulting in decrease in output.

Accordingly, the thickness of the non-magnetic metal layer or the thickness of the antiferromagnetic layer is preferably in the range of from 5 to 50 Å.

Next, when the antiferromagnetic layer (IrMn) is used, the thickness is preferably in the range of from 5 to 18 Å. When the thickness of the antiferromagnetic layer (IrMn) is set to 18 Å or less, the baseline-noise generation can be appropriately suppressed (see FIG. 16). In addition, the coercive force Hc can also be increased (see FIGS. 14A and 14B). Furthermore, when IrMn is used as the underlayer, the generation of the uniaxial exchange coupling magnetic field (Hex) can be decreased to 0. Since the baseline noise may be a thermal fluctuation noise caused by a low blocking temperature of the IrMn, when an antiferromagnetic layer having a high blocking temperature is used, the thickness thereof may be increased to more than 18 Å in some cases.

In addition, the lower limit of the thickness of the antiferromagnetic layer is preferably set to 14 Å or more, and is more preferably set to 16 Å or more. Accordingly, the coercive force Hc can be appropriately increased, and in addition, the rate of PLR generation can also be appropriately decreased. In particular, when the thickness of the antiferromagnetic layer is set to 16 Å or more, the rate of PLR generation can be decreased to approximately 0 (see FIGS. 14A, 14B, and 15). In addition, as shown in FIG. 14A, a coercive force of 800 Oe (approximately $6.32 \times 10^4$ A/m) or more can be obtained.

According to the present invention described above, in the magnetic sensor having a self-fixed magnetic layer, the mechanism of controlling the magnetostriction of the fixed magnetic layer is disclosed. Hence, when a material for the non-magnetic metal layer which is in contact with the fixed magnetic layer described above is appropriately selected, a magnetic sensor can be provided which appropriately controls the magnetostriction of the fixed magnetic layer so as to tightly fix the magnetization thereof.

In particular, when the fixed magnetic layer is formed of a plurality of magnetic layers with a non-magnetic interlayer interposed therebetween, a first magnetic layer among said plurality of magnetic layers, which is formed at a position farthest from the non-magnetic material layer described above, is provided so as to be in contact with the non-magnetic metal layer composed of an X—Mn alloy (where X is at least one selected from the group consisting of Pt, Pd, Ir, Rh, Ru, Os, Ni, and Fe).

By the structure described above, a strain can be generated in the crystal structure of the first magnetic layer, thereby increasing the magnetostriction constant λ thereof. By increasing the magnetostriction constant of the fixed magnetic layer, the magnetoelastic energy is increases, and hence the uniaxial anisotropy of the fixed magnetic layer can be increased.

When the uniaxial anisotropy of the fixed magnetic layer is increased, the magnetization thereof is tightly fixed in a predetermined direction, the output of the magnetic sensor is increased, and the stability and the symmetry thereof are also improved.

In addition, in the present invention, instead of the non-magnetic metal layer, the antiferromagnetic layer may be used. Since the thickness of the antiferromagnetic layer is very small, the uniaxial exchange coupling magnetic field (Hex) is not generated with the first magnetic layer, or even when generated, the uniaxial exchange coupling magnetic field is extremely weak. In addition, since the thickness of the antiferromagnetic layer is small, the anisotropic dispersion of the first magnetic layer is generated due to the decrease in force for holding the spin by the crystal magnetic anisotropy of the antiferromagnetic layer, and as a result, the coercive force Hc of the first magnetic layer can be increased. In the structure described above, since the coercive force can be increased in addition to the increase in magnetostriction of the fixed magnetic layer, the magnetization of the fixed magnetic layer can be more effectively fixed in the height direction, the magnetization reversal of the fixed magnetic layer can be appropriately suppressed even when a mechanical stress is generated, and hence a highly reliable magnetic sensor having stable reproduction properties can be obtained.

Although embodiments of the present invention were described above, various modifications can be applied without deviating from the scope of the present invention. The embodiments described above exemplify the present invention, but do not serve to limit the present invention. For example, although absolute numbers are given throughout this disclosure, such as the compositions of the first and second magnetic layers or the optical track width of the pinned magnetic layer, deviations from these numbers are not outside of the scope of the present invention

What is claimed is:

1. A magnetic sensor comprising:
   a fixed magnetic layer, the fixed magnetic layer containing a laminate having a first magnetic layer and a second magnetic layer and a non-magnetic interlayer interposed therebetween;
   an air bearing surface (ABS);
   a free magnetic layer laminated to the fixed magnetic layer;
   a non-magnetic material layer interposed between the fixed magnetic layer and the free magnetic layer;
   a non-magnetic metal layer composed of an X—Mn alloy, where X is at least one selected from the group consisting of Pt, Pd, Ir, Rh, Ru, Os, Ni, and Fe;
   a lower surface of the first magnetic layer of the fixed magnetic layer, in entire contact with the non-magnetic metal layer, and the second magnetic layer formed in contact with the non-magnetic material layer
   wherein a crystal of the non-magnetic metal layer and at least a part of a crystal of the first magnetic layer are placed in one of an epitaxial state and a heteroepitaxial state, and
   the fixed magnetic layer has an open end surface at the ABS;
   the non-magnetic metal layer has a thickness of about 5 to 50 Å;
   at least one of the first and second magnetic layers comprise a plurality of sublayers, the plurality of sublayers including a bcc magnetic sublayer provided at a non-magnetic interlayer side and one of: when the first magnetic layer contains the plurality of sublayers, an fcc magnetic sublayer provided at a non-magnetic metal layer side, and when the second magnetic layer contains the plurality of sublayers, an fcc magnetic sublayer provided at a non-magnetic material layer side; and
   wherein the first magnetic layer of the fixed magnetic layer in the vicinity of an interface at a non-magnetic metal layer side has a face-centered cubic (fcc) structure in which equivalent crystal planes represented by a $\{111\}$ plane are oriented in a direction parallel to the interface at the non-magnetic metal layer side, and
   the first magnetic layer of the fixed magnetic layer in the vicinity of an interface at a non-magnetic interlayer side has a body-centered cubic (bcc) structure in which equivalent crystal planes represented by a $\{110\}$ plane are oriented in a direction parallel to the interface at the non-magnetic interlayer side; and
   wherein the second magnetic layer in the vicinity of an interface at a non-magnetic material layer side has a face-centered cubic (fcc) structure in which equivalent crystal planes represented by a $\{111\}$ plane are oriented in a direction parallel to the interface at the non-magnetic material layer side, and
   the second magnetic layer in the vicinity of an interface at a non-magnetic interlayer side has a body-centered cubic (bcc) structure in which equivalent crystal planes represented by a $\{110\}$ plane are oriented in a direction parallel to the interface at the non-magnetic interlayer side; and each of the first and second magnetic layers of the fixed magnetic aver comprises one of Co and $Co_xFe_y$ (where $y \leq$ about 20 atomic % and x+y=about 100 atomic %) in the vicinity of the interface at the non-magnetic metal layer side or the non-magnetic material layer side and comprises $Co_xFe_y$ (where $y \geq$ about 20 atomic % and x+y=about 100 atomic %) in the vicinity of the interface at the non-magnetic interlayer side; and
   wherein the non-magnetic metal layer has a face-centered cubic (fcc) structure at least in the vicinity of an interface at a first magnetic layer side of the fixed magnetic layer, in which equivalent crystal planes represented by a $\{111\}$ plane are oriented in a direction parallel to the interface.

2. The magnetic sensor according to claim 1, wherein an X element content of the X—Mn alloy is about 55 to 99 atomic percent.

3. The magnetic sensor according to claim 1, further comprising bias layers on side portions of the free magnetic layer and the fixed magnetic layer, the bias layers supplying a longitudinal bias magnetic field to the free magnetic layer.

4. The magnetic sensor according to claim 1, wherein an Fe content of the first magnetic layer of the fixed magnetic layer increases from the interface at the non-magnetic metal layer side to the interface at the non-magnetic interlayer side.

5. The magnetic sensor according to claim 1, wherein a difference of a nearest interatomic distance between the non-magnetic metal layer and the first magnetic layer of the fixed magnetic layer in a plane parallel to an interface therebetween, divided by the nearest interatomic distance of the first magnetic layer, is about 0.05 to 0.20.

6. The magnetic sensor according to claim 1, wherein the first magnetic layer comprises a magnetic material having a positive magnetostriction constant.

7. The magnetic sensor according to claim 1, further comprising electrode layers comprised of a film of at least one of Cr, α-Ta, and Rh on side portions of the free magnetic layer, the non-magnetic material layer, and the fixed magnetic layer.

8. The magnetic sensor according to claim 7, wherein a spacing of a crystal lattice of the electrode layers in a direction parallel to a surface of the film is one of: at least about 0.2044 nm when the electrode layers are comprised of Cr, at least about 0.2337 nm when the electrode layers are comprised of α-Ta, and at least about 0.2200 nm when the electrode layers are comprised of Rh.

9. The magnetic sensor according to claim 1, wherein the fixed magnetic layer has an optical track width of at most about 0.15 μm.

10. The magnetic sensor according to claim 1, further comprising a seed layer comprising at least one of a NiFe alloy, a NiFeCr alloy, Cr, and Ta and having a thickness of about 35 Å to 60 Å and on which the nonmagnetic metal layer, the fixed magnetic layer, the free magnetic layer, and the nonmagnetic conductive layer are disposed.

11. A magnetic sensor comprising:
a free magnetic layer;
a non-magnetic metal layer comprising an X—Mn alloy, where X is at least one element selected from the group consisting of Pt, Pd, Ir, Rh, Ru, Os, Ni, and Fe;
a fixed magnetic layer in contact with the non-magnetic metal layer and having an open end surface at an air bearing surface, the fixed magnetic layer containing first and second magnetic layers and a non-magnetic interlayer interposed therebetween;
a non-magnetic material layer interposed between the fixed magnetic layer and the free magnetic layer; and
a lower surface of the first magnetic layer of the fixed magnetic layer formed in entire contact with an upper surface of the non-magnetic metal layer,
wherein a difference of a nearest interatomic distance between the non-magnetic metal layer and the first magnetic layer of the fixed magnetic layer in a plane parallel to an first interface therebetween, divided by the nearest interatomic distance of the first magnetic layer, is about 0.05 to 0.20, and the non-magnetic metal layer has a thickness of about 5 to about 50 Å.

12. The magnetic sensor according to claim 11, wherein the first magnetic layer has a thickness of about 10 Å to about 30 Å, and the second magnetic layer has a thickness of about 15 Å to about 35 Å.

13. The magnetic sensor according to claim 11, wherein the nonmagnetic metal layer and the first magnetic layer have crystalline lattice of the same type at the first interface.

14. The magnetic sensor according to claim 13, wherein the type of crystalline lattice of at least one of the nonmagnetic metal layer and the first magnetic layer remains the same throughout the at least one of the nonmagnetic metal layer and the first magnetic layer.

15. The magnetic sensor according to claim 11, wherein the nonmagnetic metal layer and the first magnetic layer have different types of crystalline lattices at the first interface.

16. The magnetic sensor according to claim 15, wherein the type of crystalline lattice of at least one of the nonmagnetic metal layer and the first magnetic layer remains the same throughout the at least one of the nonmagnetic metal layer and the first magnetic layer.

17. The magnetic sensor according to claim 11, wherein the composition of the first magnetic layer changes between the first interface and a second interface between the first magnetic layer and the nonmagnetic interlayer.

18. The magnetic sensor according to claim 11, wherein the first magnetic layer comprises a magnetic material having a positive magnetostriction constant.

19. The magnetic sensor according to claim 11, further comprising bias layers to supply the free magnetic layer with a longitudinal bias magnetic field, the bias layers being disposed at side ends of the free magnetic layer and the fixed magnetic layer, a thickness of the bias layers being about 100 to about 400 Å.

20. The magnetic sensor according to claim 11, wherein a magnetostriction constant $\lambda$ of the free magnetic layer is about $-0.5 \times 10^{-6} \geq \lambda \geq -8 \times 10^{-6}$.

21. The magnetic sensor according to claim 11, wherein an Fe content of at least one of the first and the second magnetic layers varies such that the at least one of the first and the second magnetic layers has a bcc structure in the vicinity of an interface at the non-magnetic interlayer side and one of: the first magnetic layer has an fcc structure, in the vicinity of an interface at a non-magnetic metal layer side of the first magnetic layer and the second magnetic layer has an fcc structure, in the vicinity of an interface at a non-magnetic material layer side of the second magnetic layer.

22. The magnetic sensor according to claim 21, wherein when the Fe content of the first magnetic layer varies, the first magnetic layer in the vicinity of the interface at the non-magnetic metal layer side is Co or fcc CoFe and in the vicinity of the interface at the non-magnetic interlayer side the first magnetic layer 23a is bcc CoFe.

23. The magnetic sensor according to claim 11, wherein an optical track width of the fixed magnetic layer is at most about 0.15 μm.

24. The magnetic sensor according to claim 11, wherein a thickness of the non-magnetic material layer is between about 17 to about 30 Å and a thickness of the free magnetic layer is about 20 to about 60 Å.

25. The magnetic sensor according to claim 20, further comprising a seed layer comprising one of a NiFe alloy, an NiFeCr alloy, Cr, and Ta and having a thickness of about 35 Å to about 60 Å and on which the nonmagnetic metal layer, the fixed magnetic layer, the free magnetic layer, and the nonmagnetic material layer are disposed.

26. The magnetic sensor according to claim 20, wherein at least one of the first and second magnetic layers comprise a plurality of layers, the plurality of layers including a bcc magnetic layer provided at a non-magnetic interlayer side and one of: when the first magnetic layer contains the plurality of layers, an fcc magnetic layer provided at a non-magnetic metal layer side, and when the second magnetic layer contains the plurality of layers, an fcc magnetic layer provided at a non-magnetic material layer side.

27. The magnetic sensor according to claim 11, wherein an X element content of the X—Mn alloy is about 55 to about 99 atomic percent.

28. The magnetic sensor according to claim 11, further comprising electrode layers comprised of a film of at least one of Cr, α-Ta, and Rh on side portions of the free magnetic layer, the non-magnetic material layer, and the fixed magnetic layer, a thickness of the electrode layers being about 400 to about 1,500 Å.

29. A magnetic sensor comprising:
a fixed magnetic layer, the fixed magnetic layer having a first magnetic layer and a second magnetic layer and a non-magnetic interlayer interposed therebetween;
a free magnetic layer laminated to the fixed magnetic layer;
a non-magnetic material layer interposed between the fixed magnetic layer and the free magnetic layer;
and an antiferromagnetic layer comprising one of IrMnm, RuMn, or —RhMn, and having a thickness in the range of from about 5 to about 18 Å; and
a lower surface of the first magnetic layer of the fixed magnetic layer formed in entire contact with an upper surface of the antiferromagnetic layer,
wherein a crystal of the antiferromagnetic layer and at least a part of a crystal of the first magnetic layer are placed in one of an epitaxial state and a heteroepitaxial stated; a value is in the range of from about 0.05 to about 0.20 which is obtained when the difference of the nearest interatomic distance between one of the first magnetic layer of the fixed magnetic layer and the non-magnetic metal layer and the antiferromagnetic layer in a plane parallel to an interface therebetween is divided by the nearest interatomic distance of the first magnetic layer; and the fixed magnetic layer has an open end surface at an air bearing surface.

30. The magnetic sensor according to claim 29, wherein the antiferromagnetic layer has a thickness in the range of from about 14 to about 18 Å.

31. The magnetic sensor according to claim 29,
wherein the content of the X element of the X—Mn alloy is in the range of from about 15 to about 29 atomic percent.

32. The magnetic sensor according to claim 29,
wherein the content of the X element of the X—Mn alloy is in the range of from about 45 to about 99 atomic percent.

33. The magnetic sensor according to claim 29,
wherein the antiferromagnetic layer has a face-centered cubic (fcc) structure in one of the entire region thereof and in the vicinity of an interface at the first magnetic layer side of the fixed magnetic layer, in which equivalent crystal planes represented by the {111} plane are oriented substantially in a direction parallel to the interface.

34. The magnetic sensor according to claim 29, further comprising bias layers on two side portions of the free magnetic layer and the fixed magnetic layer, the bias layers supplying a longitudinal bias magnetic field to the free magnetic layer.

35. The magnetic sensor according to claim 29,
wherein the first magnetic layer of the fixed magnetic layer has a face-centered cubic (fcc) structure in one of the entire region thereof and at an antiferromagnetic layer side, in which equivalent crystal planes represented by the {111} plane are oriented substantially in the direction parallel to the interface.

36. The magnetic sensor according to claim 35,
wherein the first magnetic layer of the fixed magnetic layer comprises Co or $Co_xFe_y$ (where $y \leq 20$ atomic % and x+y=100 atomic % are satisfied).

37. The magnetic sensor according to claim 29,
wherein the first magnetic layer of the fixed magnetic layer has a body-centered cubic (bcc) structure in one of the entire region thereof and the antiferromagnetic layer side, in which equivalent crystal planes represented by the {110} plane are oriented substantially in the direction parallel to the interface.

38. The magnetic sensor according to claim 37,
wherein the first magnetic layer of the fixed magnetic layer comprises $Co_xFe_y$ (where $y \geq 20$ atomic % and x+y=100 atomic % are satisfied).

39. The magnetic sensor according to claim 29,
wherein the first magnetic layer of the fixed magnetic layer in the vicinity of an interface at the antiferromagnetic layer side has a face-centered cubic (fcc) structure in which equivalent crystal planes represented by the {111} plane are oriented substantially in the direction parallel to the interface, and the first magnetic layer of the fixed magnetic layer in the vicinity of an interface at the non-magnetic interlayer side has a body-centered cubic (bcc) structure in which equivalent crystal planes represented by the {110} plane are oriented substantially in a direction parallel to the interface at the non-magnetic interlayer side.

40. The magnetic sensor according to claim 39,
wherein the first magnetic layer of the fixed magnetic layer comprises $Co_xFe_y$ (where $y \leq 20$ atomic % and x+y=100 atomic % are satisfied) in the vicinity of the interface at the antiferromagnetic layer side, and comprises $Co_xFe_y$ (where $y \geq 20$ atomic % and x+y=100 atomic % are satisfied) in the vicinity of the interface at the non-magnetic interlayer side.

41. The magnetic sensor according to claim 40,
wherein an Fe content of the first magnetic layer of the fixed magnetic layer is increased from the interface at the antiferromagnetic layer side toward the interface at the non-magnetic interlayer side.

42. The magnetic sensor according to claim 29,
wherein the first magnetic layer comprises a magnetic material having a positive magnetostriction constant.

43. The magnetic sensor according to claim 29, further comprising electrode layers comprising of a film of at least one of Cr, α-Ta, and Rh on two side portions of the free magnetic layer, the non-magnetic material layer, and the fixed magnetic layer.

44. The magnetic sensor according to claim 43,
wherein a spacing of the crystal lattice of the electrodes, which are composed of the film of one of Cr, α-Ta, and Rh, in a direction parallel to a surface of the film, is 0.2044 nm or more (the {110} spacing of a bcc structure), 0.2337 nm or more (the {110} spacing of a bcc structure), 0.2200 nm or more (the {111} spacing of an fcc structure), respectively.

45. The magnetic sensor according to claim 29,
wherein the fixed magnetic layer has an optical track width of about 0.15 μm or less.

* * * * *

UNITED STATES PATENT AND TRADEMARK OFFICE
CERTIFICATE OF CORRECTION

| | | |
|---|---|---|
| PATENT NO. | : 7,362,546 B2 | Page 1 of 1 |
| APPLICATION NO. | : 10/925268 | |
| DATED | : April 22, 2008 | |
| INVENTOR(S) | : Naoya Hasegawa et al. | |

It is certified that error appears in the above-identified patent and that said Letters Patent is hereby corrected as shown below:

Columns 29-30, in claim 1, line 60, after "the fixed magnetic" delete "aver" and substitute --layer-- in its place.

Signed and Sealed this

Second Day of September, 2008

JON W. DUDAS
*Director of the United States Patent and Trademark Office*